(12) United States Patent
Yamamoto

(10) Patent No.: US 10,431,697 B2
(45) Date of Patent: Oct. 1, 2019

(54) BI-DIRECTIONAL ZENER DIODE HAVING A FIRST AND SECOND IMPURITY REGIONS GROUPS FORMED IN SURFACE PORTION OF A SUBSTRATE AND A FIRST ELECTRODE ELECTRICALLY CONNECTED TO AT LEAST ONE FIRST IMPURITY REGIONS, AND NOT CONNECTED FROM AT LEAST ANOTHER ONE

(71) Applicant: ROHM CO., LTD., Kyoto (JP)

(72) Inventor: Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 61 days.

(21) Appl. No.: 15/273,380

(22) Filed: Sep. 22, 2016

(65) Prior Publication Data

US 2017/0092784 A1    Mar. 30, 2017

(30) Foreign Application Priority Data

Sep. 25, 2015  (JP) .................... 2015-188513
Sep. 25, 2015  (JP) .................... 2015-188514
Jul. 27, 2016   (JP) .................... 2016-147655

(51) Int. Cl.
  *H01L 29/866* (2006.01)
  *H01L 29/66* (2006.01)
  *H01L 29/417* (2006.01)
  *H01L 21/225* (2006.01)

(52) U.S. Cl.
  CPC .......... *H01L 29/866* (2013.01); *H01L 29/417* (2013.01); *H01L 29/66106* (2013.01); *H01L 21/2253* (2013.01)

(58) Field of Classification Search
  CPC .................... H01L 29/866; H01L 29/66106
  See application file for complete search history.

(56) References Cited

U.S. PATENT DOCUMENTS

| | | | |
|---|---|---|---|
| 6,015,999 A | 1/2000 | Yu et al. | |
| 2015/0216044 A1* | 7/2015 | Tamagawa | H01G 4/30 361/752 |
| 2015/0243612 A1* | 8/2015 | Yamamoto | H01L 24/06 257/693 |
| 2015/0255628 A1* | 9/2015 | Yamamoto | H01L 27/0255 257/603 |

(Continued)

FOREIGN PATENT DOCUMENTS

WO    WO 2013/058232 A1 *  4/2013  ........... H01L 29/866

*Primary Examiner* — Anh D Mai
(74) *Attorney, Agent, or Firm* — Rabin & Berdo, P.C.

(57) ABSTRACT

A bidirectional Zener diode includes a substrate. A first conductivity type base region is formed in a surficial portion of the substrate. A second conductivity type first impurity region is formed in a surficial portion of the base region so as to form a pn junction with the base region. A second conductivity type second impurity region is formed in a surficial portion of the base region in a manner spaced apart from the first impurity region so as to form a pn junction with the base region. A first electrode is arranged at the surface of the substrate. A second electrode is arranged at the surface of the substrate. A dimension of the base region along the surface of the substrate between the first impurity region and the second impurity region is equal to or greater than 4.0 μm and equal to or smaller than 12.5 μm.

10 Claims, 30 Drawing Sheets

(56) References Cited

U.S. PATENT DOCUMENTS

| | | | |
|---|---|---|---|
| 2015/0305159 A1* | 10/2015 | Yamamoto | H01G 4/40 |
| | | | 361/767 |
| 2015/0332842 A1* | 11/2015 | Shimoichi | H01F 27/292 |
| | | | 336/200 |
| 2017/0019083 A1* | 1/2017 | Fukae | H03H 7/06 |
| 2017/0256536 A1* | 9/2017 | Nishida | H01L 27/0635 |
| 2018/0042118 A1* | 2/2018 | Kondo | H05K 3/045 |

* cited by examiner

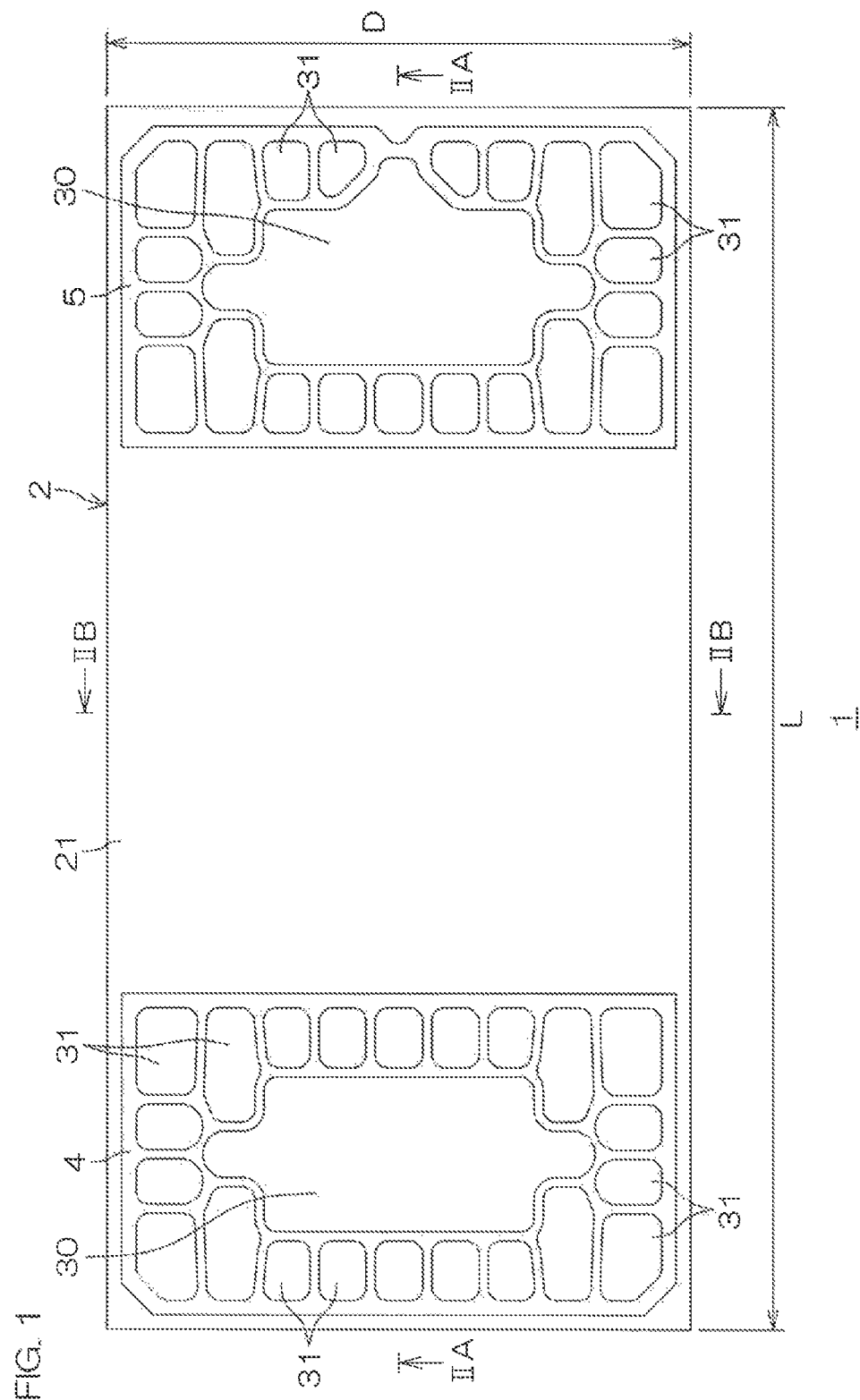

TEG3

TEG4

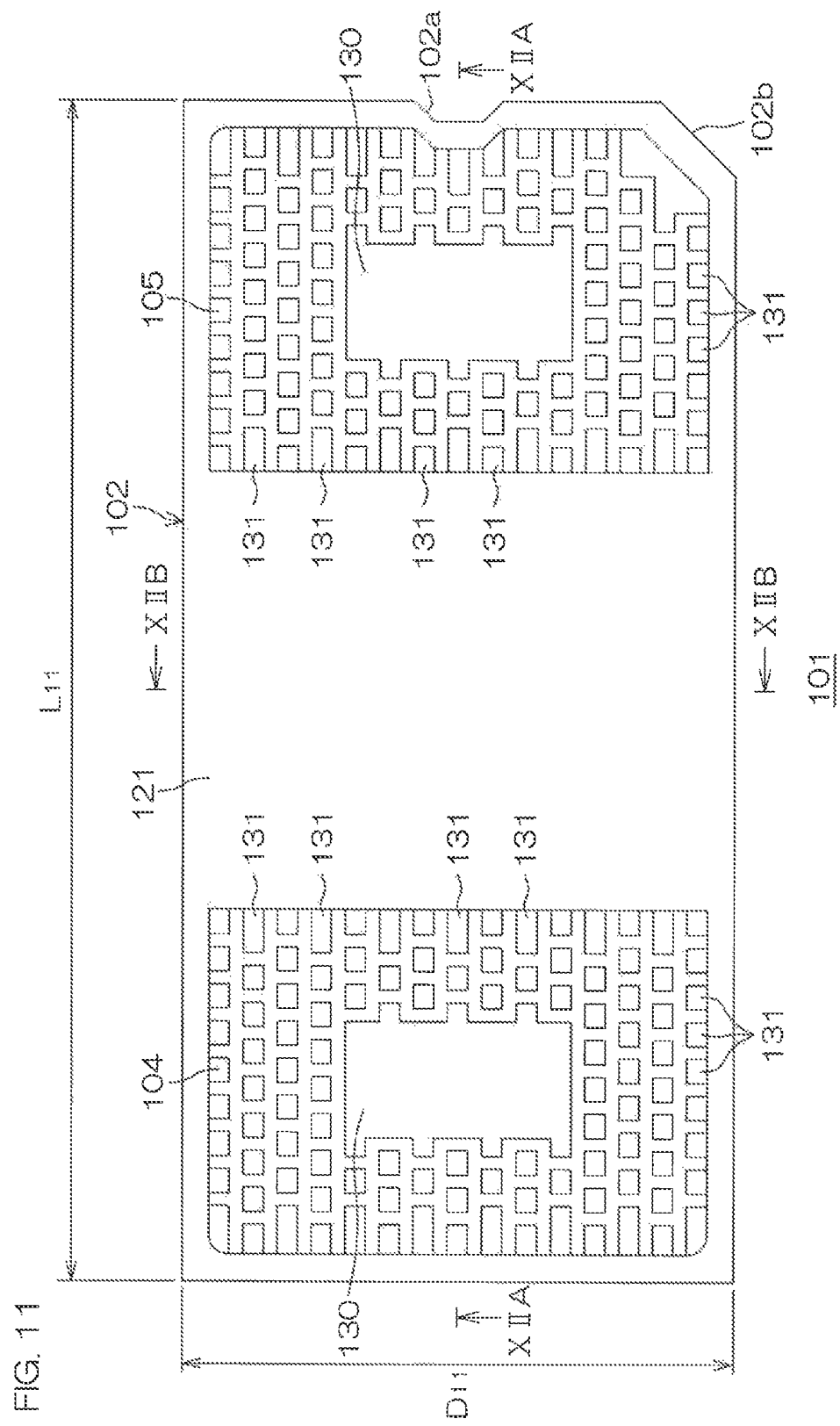

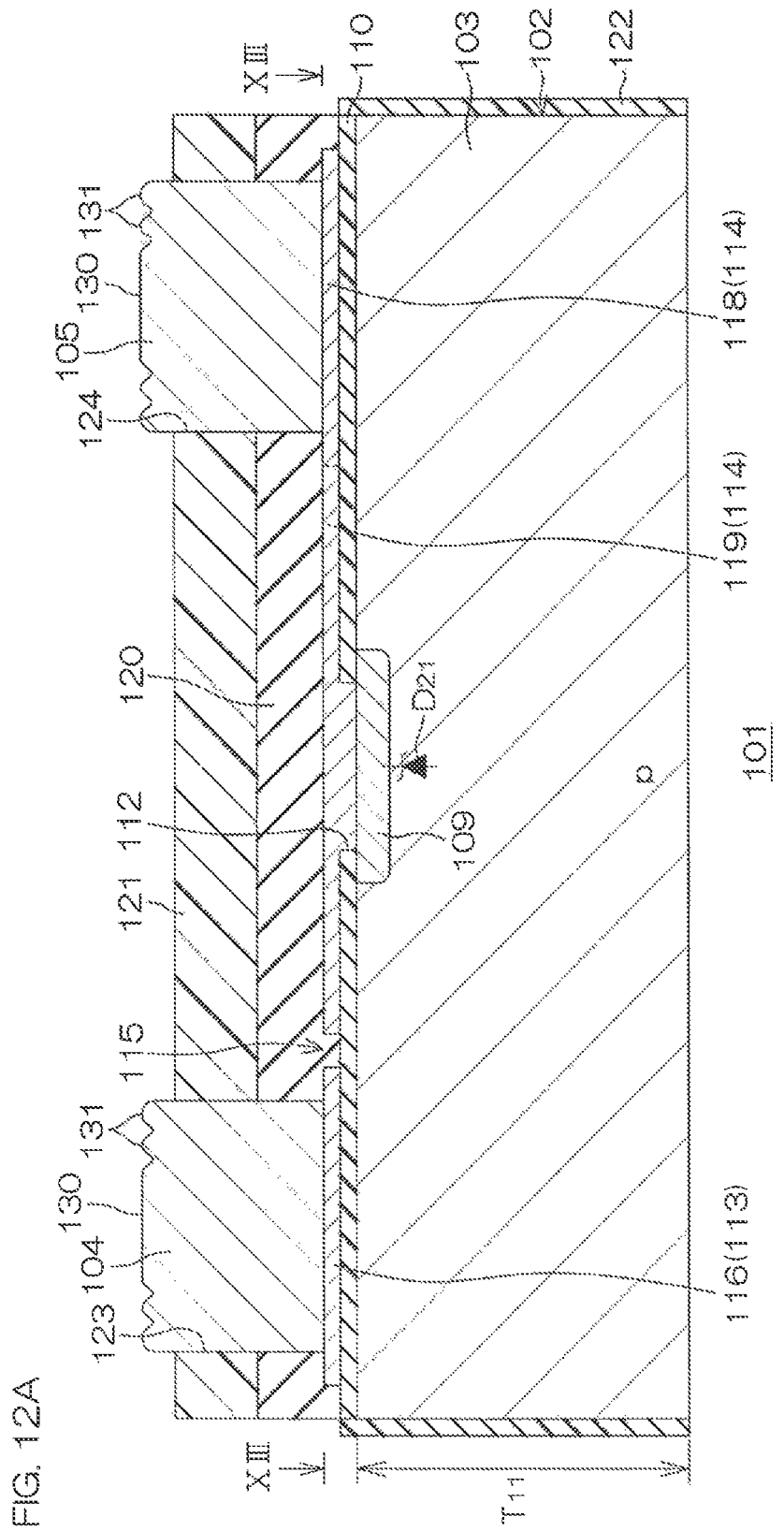

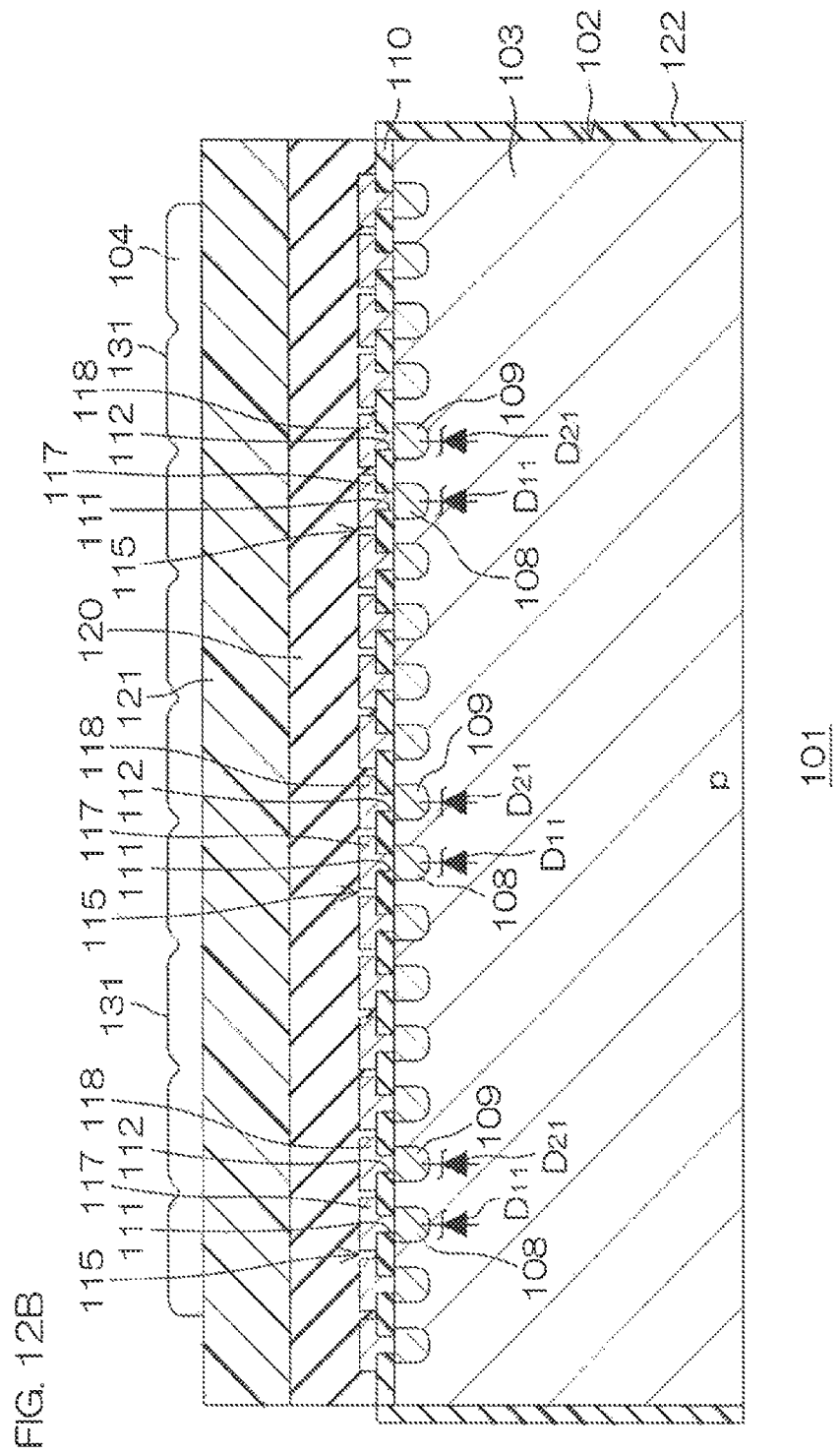

FIG. 15

| | TEG201 | TEG202 | | | TEG203 | | | TEG204 | | | TEG205 | | | TEG206 | | | |
|---|---|---|---|---|---|---|---|---|---|---|---|---|---|---|---|---|---|
| | | A | B | C | A | B | C | A | B | C | A | B | C | A | B | C | D | E |
| | 1.3 | 1.3 | 1.3 | 1.3 | 1.3 | 1.3 | 1.3 | 1.3 | 1.3 | 1.3 | 1.3 | 1.3 | 1.3 | 1.3 | 1.3 | 1.3 | 1.3 | 1.3 |
| | 0 | 0.5 | 0.3 | 0 | 1 | 0.5 | 0 | 2 | 1 | 0 | 2.5 | 1.5 | 0 | 2.5 | 2 | 1.5 | 1 | 0 |
| | 1 | 1 | 1.4 | 2 | 1 | 2 | 3 | 1 | 3 | 5 | 2 | 4 | 7 | 4 | 5 | 6 | 7 | 9 |
| | 0 | 0.5 | 0.3 | 0 | 1 | 0.5 | 0 | 2 | 1 | 0 | 2.5 | 1.5 | 0 | 2.5 | 2 | 1.5 | 1 | 0 |
| | 1.3 | 1.3 | 1.3 | 1.3 | 1.3 | 1.3 | 1.3 | 1.3 | 1.3 | 1.3 | 1.3 | 1.3 | 1.3 | 1.3 | 1.3 | 1.3 | 1.3 | 1.3 |
| | 1.4 | 1.4 | 1.4 | 1.4 | 1.4 | 1.4 | 1.4 | 1.4 | 1.4 | 1.4 | 1.4 | 1.4 | 1.4 | 1.4 | 1.4 | 1.4 | 1.4 | 1.4 |

$V_{11}$, $U_{11}$, $W_{11}$, $Y_{11}$, $U_{11}$, $V_{11}$, $Z_{11}$

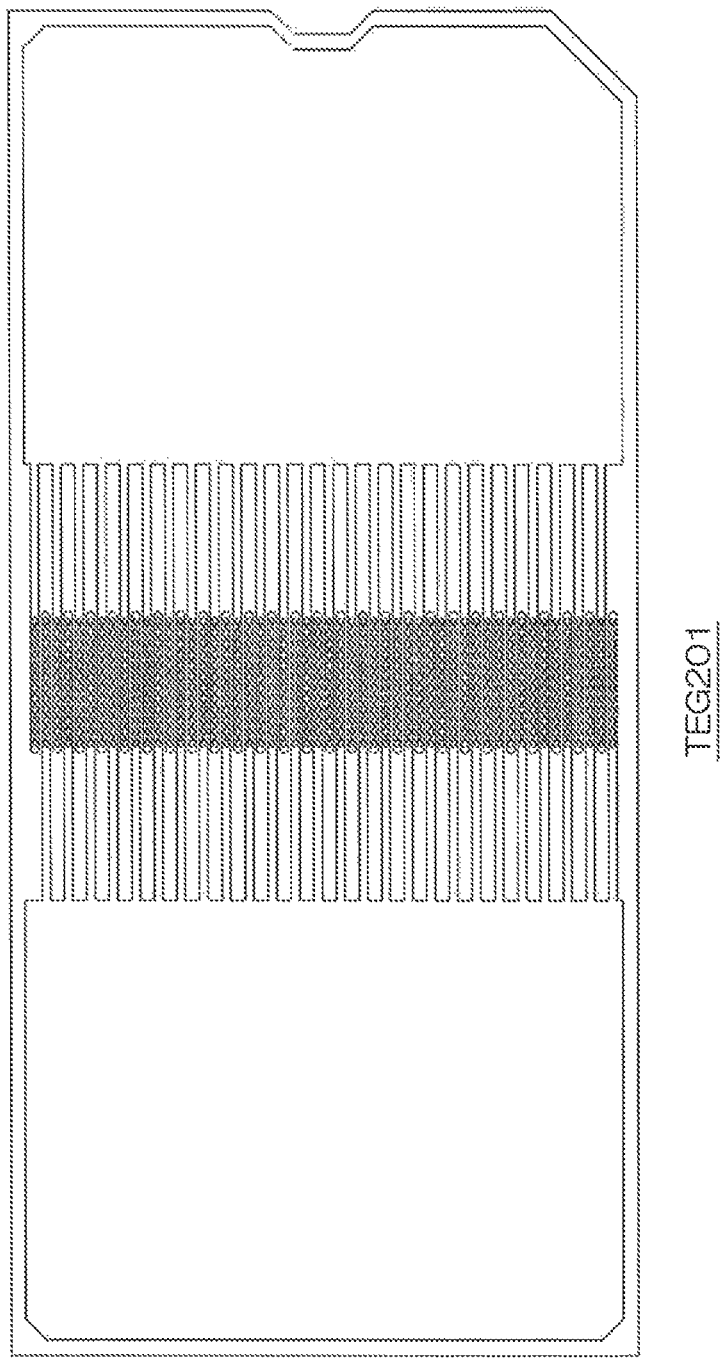

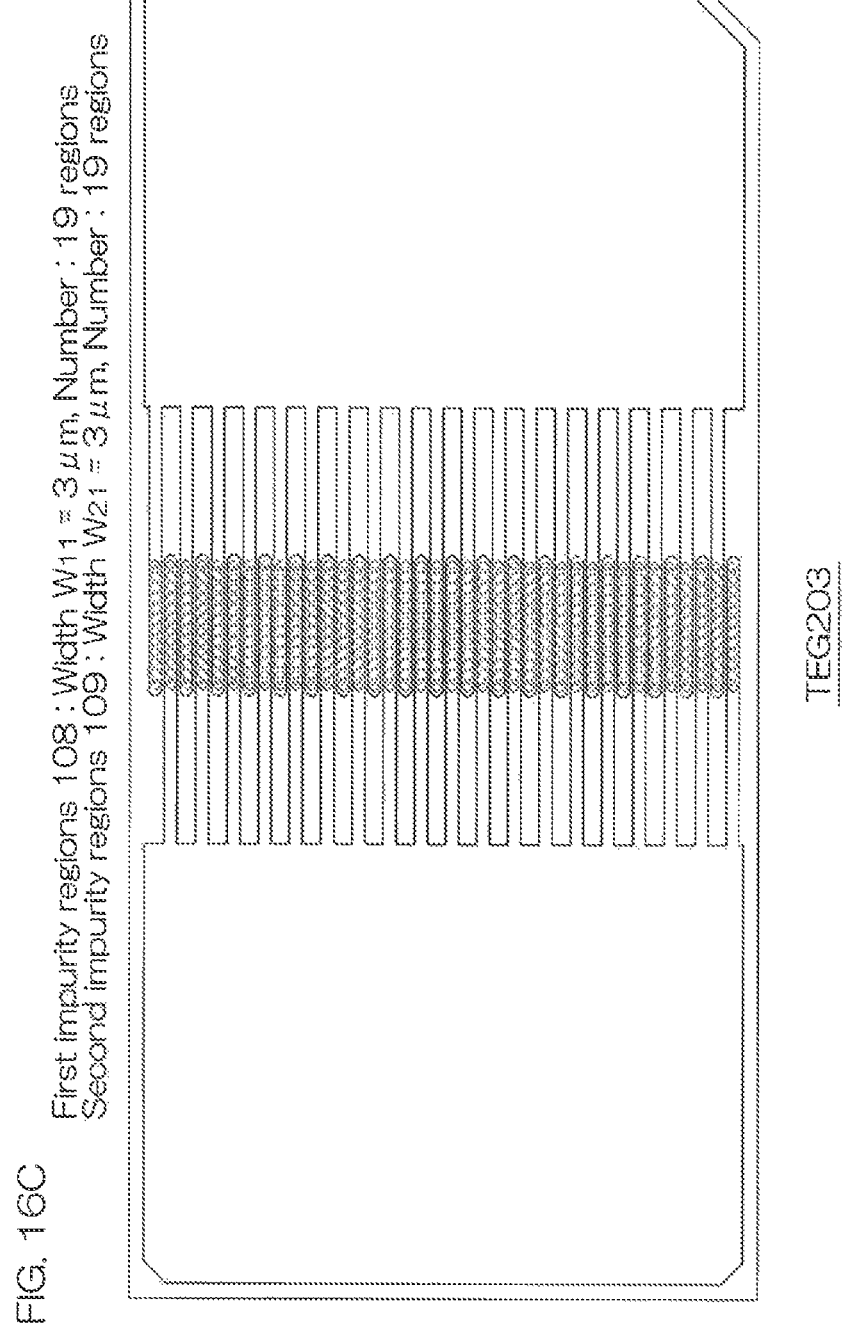

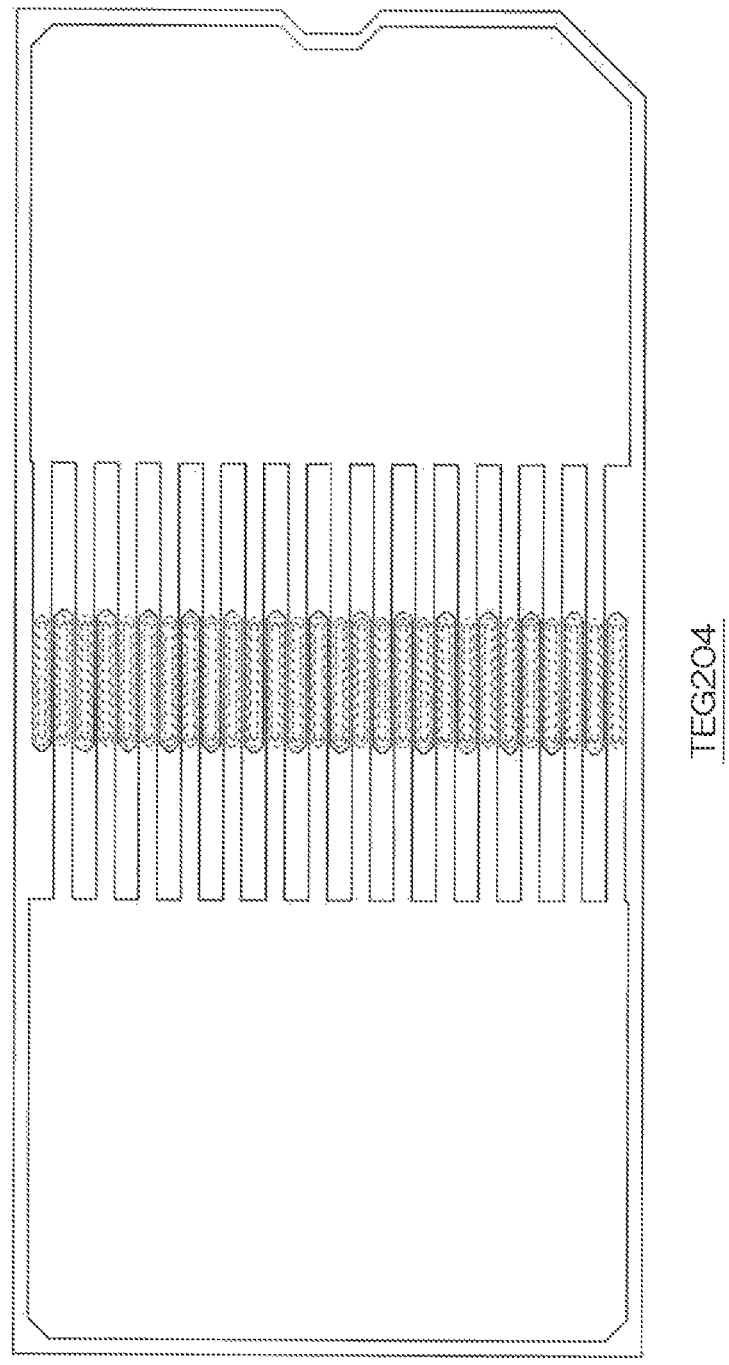

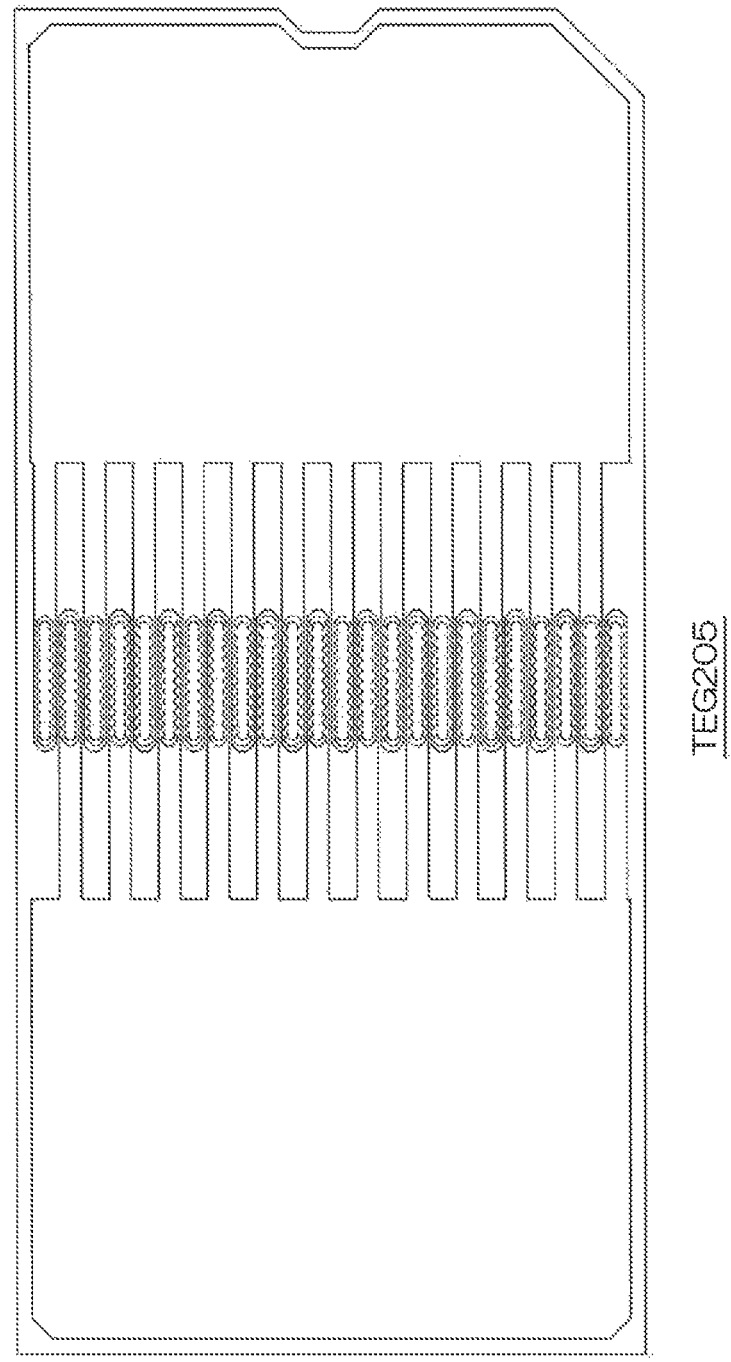

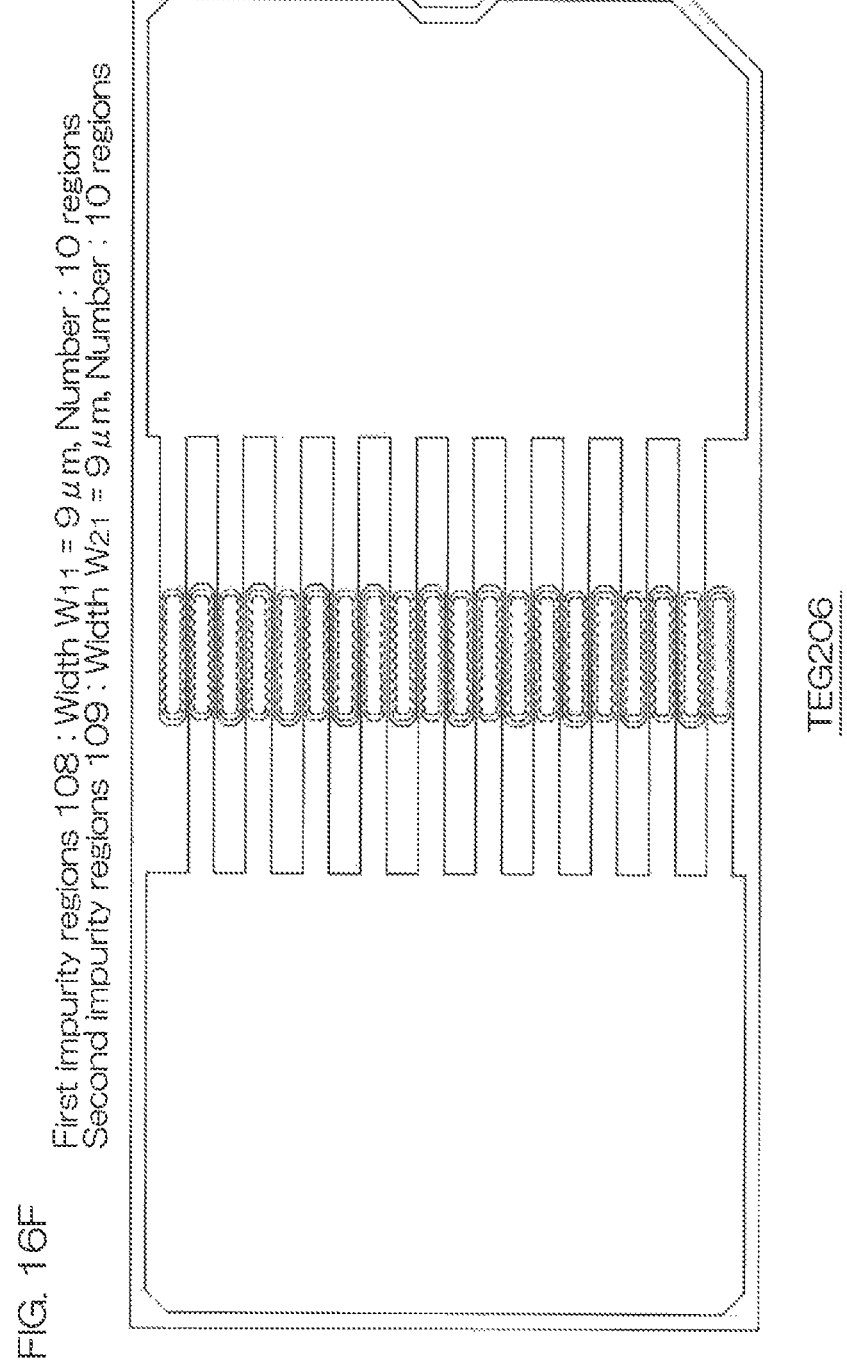

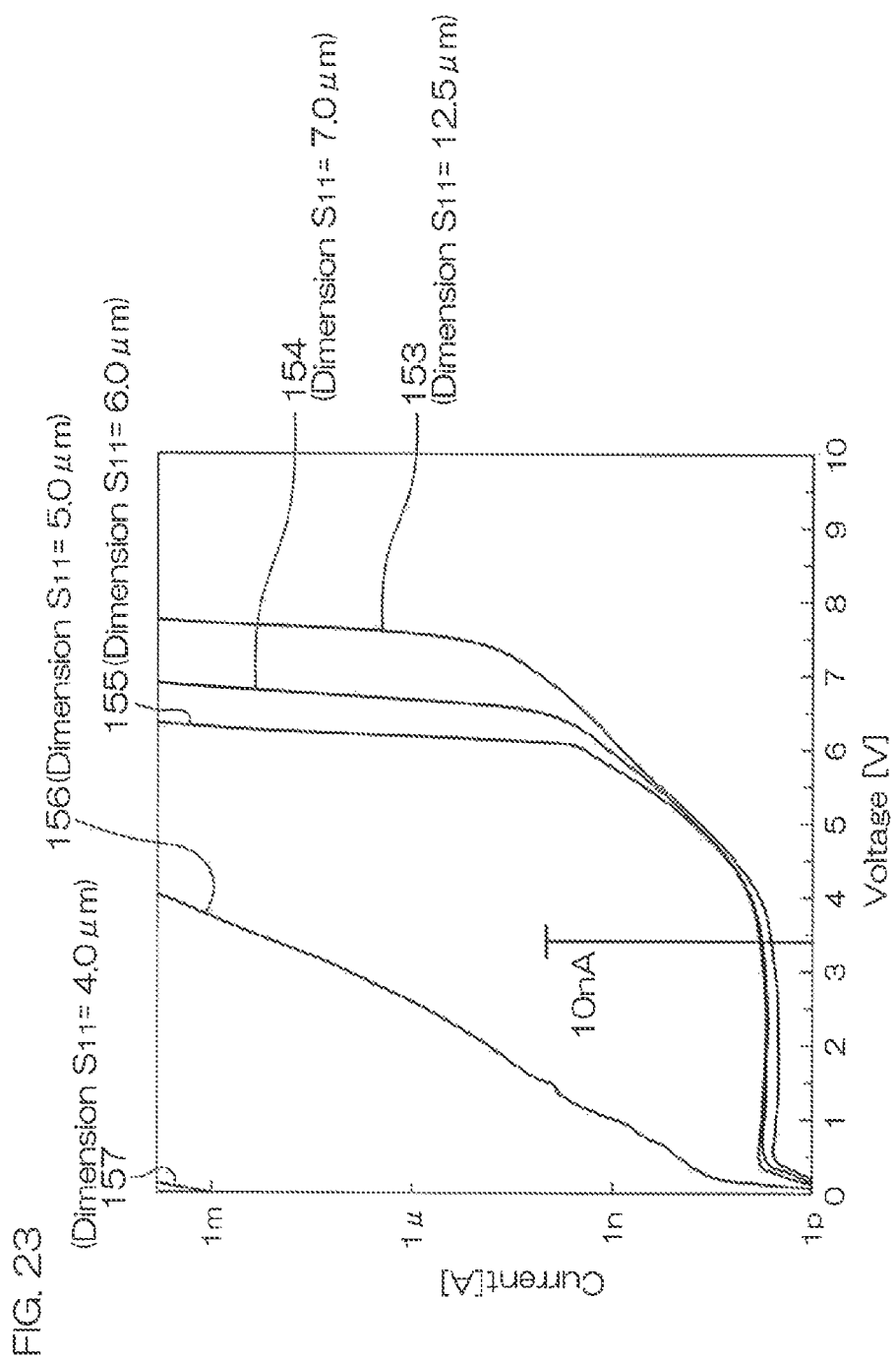

BI-DIRECTIONAL ZENER DIODE HAVING A FIRST AND SECOND IMPURITY REGIONS GROUPS FORMED IN SURFACE PORTION OF A SUBSTRATE AND A FIRST ELECTRODE ELECTRICALLY CONNECTED TO AT LEAST ONE FIRST IMPURITY REGIONS, AND NOT CONNECTED FROM AT LEAST ANOTHER ONE

BACKGROUND OF THE INVENTION

1. Field of the Invention

The present invention relates to a bidirectional Zener diode and a method for manufacturing the same.

2. Description of the Related Art

TVS (Transient Voltage Suppressor) devices are known for absorbing transient overvoltage, ESD (Electrostatic Discharge), noise, etc. TVS devices can be composed of various devices and, in general, employ devices having a structure in which a pair of diodes is connected in reverse series. One such example is disclosed in U.S. Pat. No. 6,015,999A.

U.S. Pat. No. 6,015,999A discloses a diode with an nppn layered structure including an n+ type substrate, a p− layer formed in a surficial portion of the substrate, a p+ layer formed in a surficial portion of the p− layer, and an n+ layer formed in a surficial portion of the p+ layer.

SUMMARY OF THE INVENTION

A bidirectional Zener diode of the present invention includes a substrate. A first conductivity type base region is formed in a surficial portion of the substrate. A second conductivity type first impurity region is formed in a surficial portion of the base region so as to form a pn junction between the first impurity region and the base region. A second conductivity type second impurity region is formed in a surficial portion of the base region in a manner spaced apart from the first impurity region so as to form a pn junction between the second impurity region and the base region. A first electrode is arranged at a surface of the substrate so as to be connected electrically to the first impurity region. A second electrode is arranged at the surface of the substrate so as to be connected electrically to the second impurity region. A dimension of the base region along the surface of the substrate between the first impurity region and the second impurity region is set to be equal to or greater than 4.0 μm and equal to or smaller than 12.5 μm.

These and other objects, features, and advantages of the present invention will become apparent from the following description of preferred embodiments with reference to the accompanying drawings.

BRIEF DESCRIPTION OF THE DRAWINGS

FIG. 1 is a plan view of a bidirectional Zener diode according to a preferred embodiment of the present invention.

FIG. 11 is a plan view of a bidirectional Zener diode according to a reference example.

FIG. 12A is a vertical cross-sectional view along XIIA-XIIA line in FIG. 11.

FIG. 12B is a vertical cross-sectional view along XIIB-XIIB line in FIG. 11.

FIG. 15 is a table showing the dimensions of evaluation devices for which a current-voltage characteristic is to be evaluated.

FIG. 16A is a plan view of a first evaluation device for which a current-voltage characteristic is to be evaluated.

FIG. 16C is a plan view of a third evaluation device for which a current-voltage characteristic is to be evaluated.

FIG. 16D is a plan view of a fourth evaluation device for which a current-voltage characteristic is to be evaluated.

FIG. 16E is a plan view of a fifth evaluation device for which a current-voltage characteristic is to be evaluated.

FIG. 16F is a plan view of a sixth evaluation device for which a current-voltage characteristic is to be evaluated.

FIG. 23 is a graph showing current-voltage characteristic of evaluation devices when a high-temperature process is applied in Step S104 of FIG. 21.

DETAILED DESCRIPTION OF THE PREFERRED EMBODIMENTS

Figure 2A:
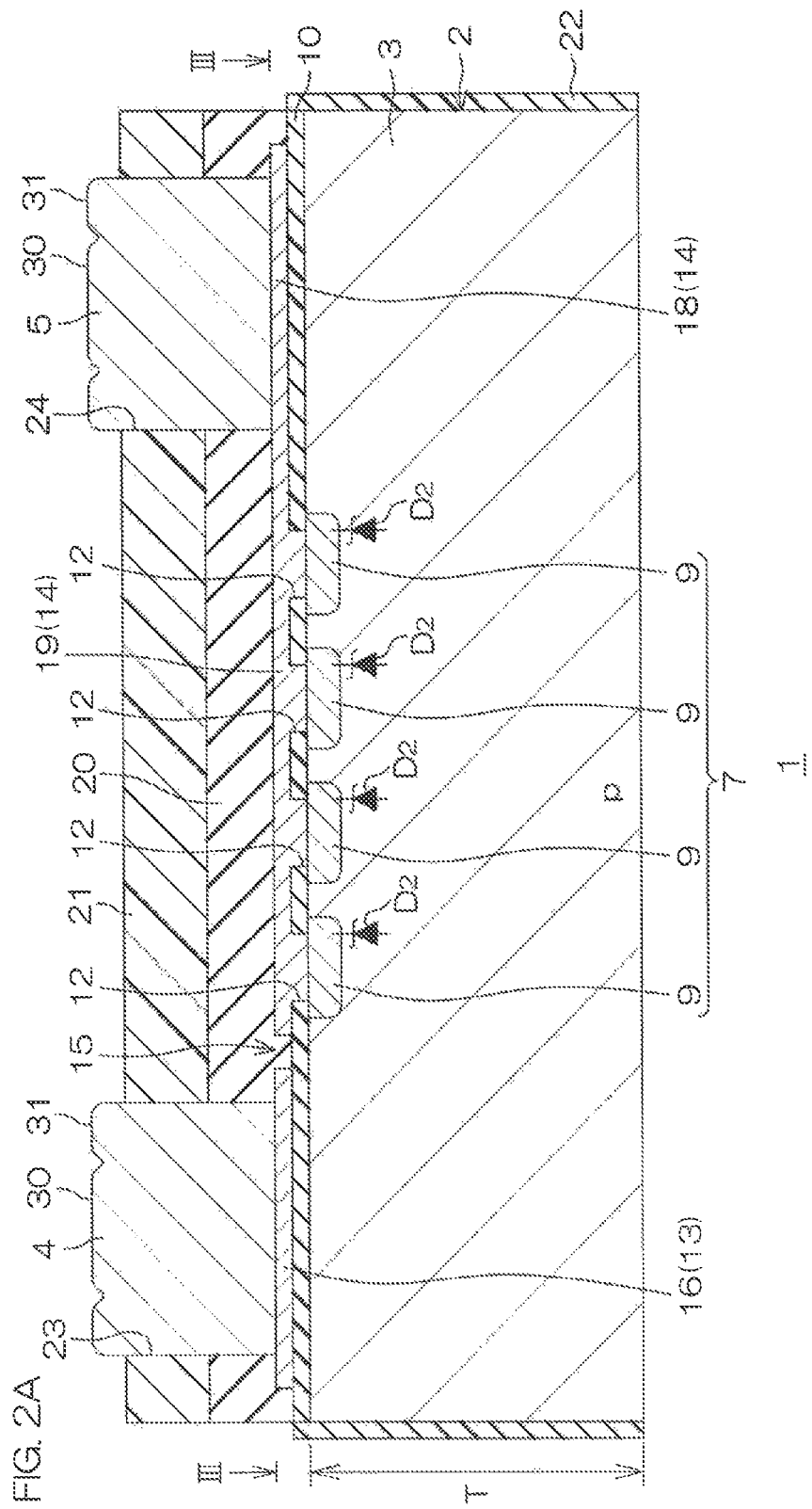
FIG. 2A is a vertical cross-sectional view along IIA-IIA line in FIG. 1.

A TVS device with a structure in which a pair of diodes is connected in reverse series has, as its electrical properties, various parameters such as reverse breakdown voltage, reverse stand-off voltage, leakage current, etc. In U.S. Pat. No. 6,015,999A referenced above, these various parameters are adjusted by the nppn layered structure. The nppn layered structure, however, requires multiple pn junctions to be fabricated in a layered direction, resulting in a complicated manufacturing process and therefore cost increases.

Hence, the inventors have considered fabricating, in a surficial portion of a substrate, a bidirectional Zener diode in which a pair of Zener diodes is connected in reverse series as a TVS device. The bidirectional Zener diode only requires a pair of pn junctions to be fabricated in a manner spaced apart from each other in the surficial portion of the substrate, resulting in a relatively simple structure and therefore cost increases can be suppressed. However, only forming a pair of pn junctions in a manner spaced apart from each other in the surficial portion of the substrate would lead to an increase in the leakage current when trying to achieve a low reverse breakdown voltage and a low reverse stand-off voltage.

The present invention provides a bidirectional Zener diode and a method for manufacturing such a bidirectional Zener diode with which can suppress cost increases and excellent electrical properties can be achieved.

A bidirectional Zener diode of the present invention includes a substrate. A first conductivity type base region is formed in a surficial portion of the substrate. A second conductivity type first impurity region is formed in a surficial portion of the base region so as to form a pn junction between the first impurity region and the base region. A second conductivity type second impurity region is formed in a surficial portion of the base region in a manner spaced apart from the first impurity region so as to form a pn junction between the second impurity region and the base region. A first electrode is arranged at a surface of the substrate so as to be connected electrically to the first impurity region. A second electrode is arranged at the surface of the substrate so as to be connected electrically to the second impurity region. In this arrangement, the dimension of the base region along the surface of the substrate between the first impurity region and the second impurity region is set to be equal to or greater than 4.0 µm and equal to or smaller than 12.5 µm.

In accordance with the bidirectional Zener diode of the present invention, the dimension of the base region along the surface of the substrate between the first impurity region and the second impurity region is equal to or greater than 4.0 µm and equal to or smaller than 12.5 µm. This allows excellent electrical properties to be achieved. For example, including the features of the bidirectional Zener diode of the present invention allows a reverse breakdown current of equal to or greater than 100 µA and equal to or smaller than 10 mA and a reverse breakdown voltage of equal to or greater than 6 V and equal to or smaller than 7 V to be achieved. Including the features of the bidirectional Zener diode of the present invention also allows a reverse stand-off voltage of equal to or greater than 3 V and equal to or smaller than 5 V to be achieved. Further, including the features of the bidirectional Zener diode of the present invention further allows a leakage current of equal to or smaller than 10 nA to be achieved when the reverse stand-off voltage is applied.

Further, in accordance with the bidirectional Zener diode of the present invention, it is only required to form, in the surficial portion of the base region, the first impurity region and the second impurity region in a manner spaced apart from each other, which allows a relatively simple structure to be achieved. Accordingly, no complicated process is required for the formation of the pn junctions and thereby cost increases can be suppressed.

A preferred embodiment of the present invention and a reference example will hereinafter be described in detail with reference to the accompanying drawings.

Preferred Embodiment

Figure 2B:
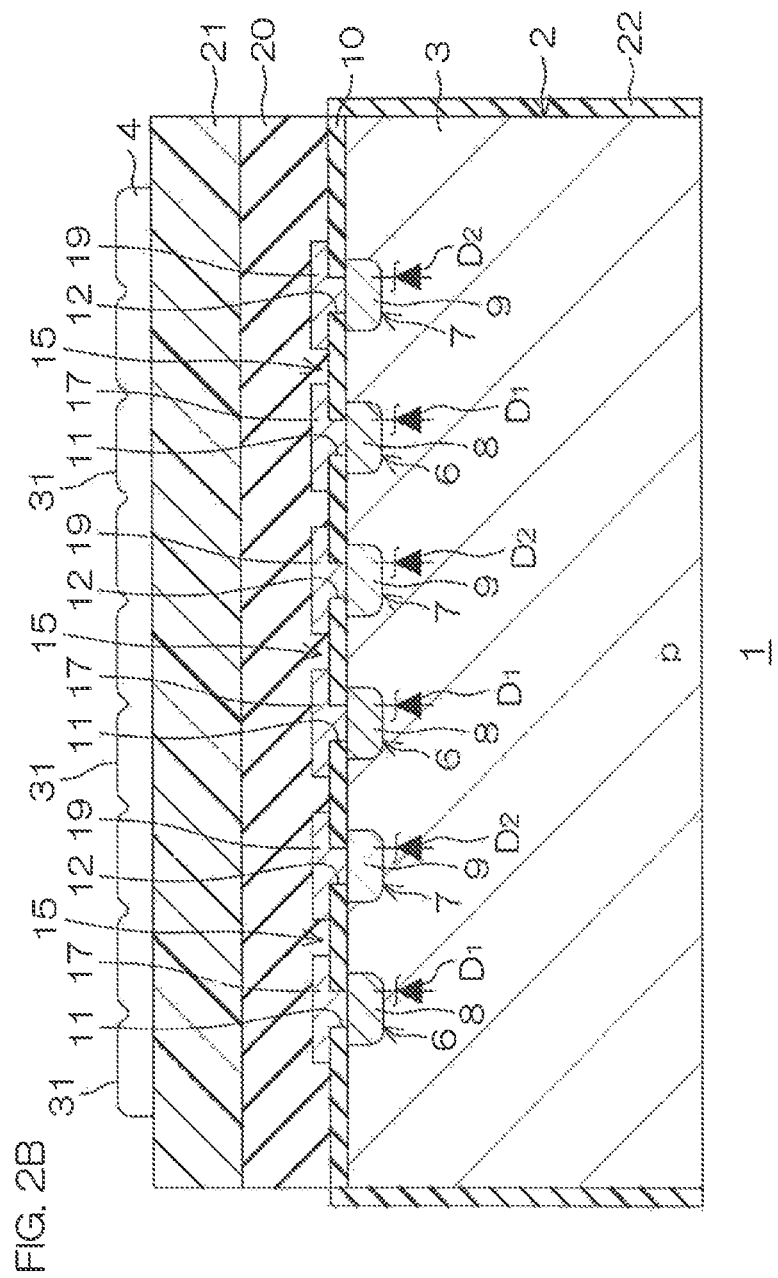
FIG. 2B is a vertical cross-sectional view along IIB-IIB line in FIG. 1.
Figure 3:
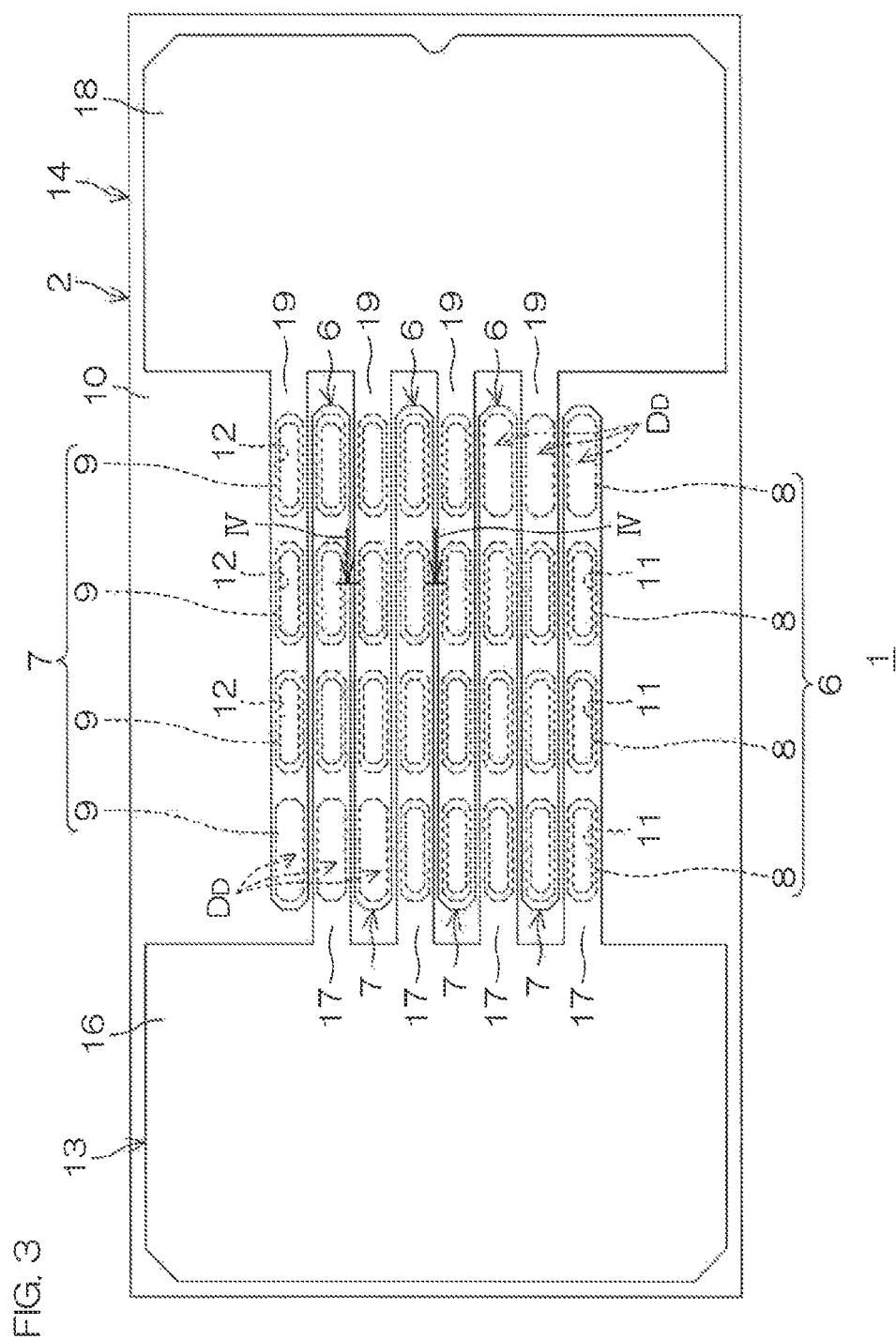
FIG. 3 is a horizontal cross-sectional view along III-III line in FIG. 2A.

FIG. 1 is a plan view of a bidirectional Zener diode 1 according to a preferred embodiment of the present invention. FIG. 2A is a vertical cross-sectional view along IIA-IIA line in FIG. 1. FIG. 2B is a vertical cross-sectional view along IIB-IIB line in FIG. 1. FIG. 3 is a horizontal cross-sectional view along III-III line in FIG. 2A.

The bidirectional Zener diode 1 includes a substrate 2 having a rectangular shape in planar view. The substrate 2 may be a silicon substrate. A length L of a long side along a longitudinal direction of the substrate 2 is, for example, equal to or greater than 0.3 mm and equal to or smaller than 0.6 mm. A length D of a short side along a lateral direction is, for example, equal to or greater than 0.15 mm and equal to or smaller than 0.3 mm. A thickness T of the substrate 2 is, for example, 0.1 mm. The substrate 2 having those sizes allows the bidirectional Zener diode 1 to be formed as a so-called chip component and thereby to be applied to various applications.

Referring to FIGS. 2A and 2B, a p type base region 3 is formed in a surficial portion of the substrate 2 so as to expose through a surface of the substrate 2. More specifically, in this preferred embodiment, p type impurities are introduced from the surface to a second surface (backside) of the substrate 2. This causes the base region 3 to be formed over the entire substrate 2 and results in an aspect in which the substrate 2 can be considered as a p type substrate. A specific resistance of the substrate 2 is around 5 mΩ·cm due to the introduction of the p type impurities.

A first external electrode 4 (first electrode) and a second external electrode 5 (second electrode) are arranged above the surface of the substrate 2. The first external electrode 4 is arranged at one end portion side of the substrate 2. The second external electrode 5 is arranged at the other end portion side of the substrate 2.

Referring to FIGS. 2A, 2B, and 3, multiple (four in this preferred embodiment) first impurity region groups 6 and multiple (four in this preferred embodiment) second impurity region groups 7 are formed in a surficial portion of the base region 3 between the first external electrode 4 and the second external electrode 5. The first impurity region groups 6 and the second impurity region groups 7 are connected electrically to the first external electrode 4 and the second external electrode 5.

The first impurity region groups 6 and the second impurity region groups 7 are arranged alternately along the lateral direction of the substrate 2. The first impurity region groups 6 include multiple (four in this preferred embodiment) n type first impurity regions 8 arranged in a manner spaced apart from each other along the longitudinal direction of the substrate 2. The multiple n type first impurity regions are formed in a manner extending along the longitudinal direction of the substrate 2. The second impurity region groups 7 include multiple (four in this preferred embodiment) n type second impurity regions 9 arranged in a manner spaced apart from each other along the longitudinal direction of the substrate 2. The multiple n type second impurity regions 9 are formed in a manner extending in parallel with the first impurity region groups 6.

The first impurity regions 8 and the second impurity regions 9 are arranged in an abutting manner in the lateral direction of the substrate 2. The first impurity regions 8 and the second impurity regions 9 are also arranged alternately along the lateral direction of the substrate 2. In the surficial portion of the substrate 2, the first impurity regions 8 and the second impurity regions 9 are thus aligned and arranged in a matrix of eight rows and four columns.

Given the first, second, . . . , and eighth rows from the top and the first, second, third, and fourth columns from the left in FIG. 3, the first impurity region groups 6 are formed in the even rows and the second impurity region groups 7 are formed in the odd rows. In each first impurity region group 6, the first impurity regions 8 are arranged one-on-one in the first to fourth columns. Similarly, in each second impurity region group 7, the second impurity regions 9 are arranged one-on-one in the first to fourth columns.

The first impurity regions 8 and the second impurity regions 9 are formed so as to have a same depth and a same n type impurity concentration. The n type impurity concentration of each first impurity region 8 and each second impurity region 9 is, for example, equal to or greater than $1.0 \times 10^{19}$ cm$^{19}$ cm$^{-3}$ and equal to or smaller than $1.0 \times 10^{21}$ cm$^{-3}$. All of the first impurity regions 8 and the second impurity regions 9 are formed so as to have a same shape and a same area in planar view. In planar view, the first impurity regions 8 and the second impurity regions 9 are each formed in a rectangular shape (a rounded-corner rectangular shape) which extends along the longitudinal direction of the substrate 2 and has the four corners being cut.

The first impurity regions 8 form pn junctions with the base region 3. A first Zener diodes $D_1$ is formed by the pn junction portions between the first impurity regions 8 and the base region 3. The second impurity regions 9 form pn junctions with the base region 3. A second Zener diodes $D_2$ is formed by the pn junction portions between the second impurity regions 9 and the base region 3. The first Zener diodes $D_1$ and the second Zener diodes $D_2$ are connected in reverse series via the base region 3. The first impurity regions 8 and the second impurity regions 9 are formed in a manner spaced apart from each other such that depletion layers extending from the pn junction portions between the first impurity regions 8 and the base region 3 do not overlap depletion layers extending from the pn junction portions between the second impurity regions 9 and the base region 3.

Referring to FIGS. 2A and 2B, an insulating film 10 is formed on the surface of the substrate 2. The insulating film 10 is, for example, a silicon dioxide film. First contact holes 11 which expose the first impurity regions 8 and second contact holes 12 which expose the second impurity regions 9 are formed in the insulating film 10. A first internal electrode film 13 and a second internal electrode film 14 are formed on the insulating film 10.

The first internal electrode film 13 integrally includes a first pad electrode film 16 and multiple first extraction electrode films 17. The first pad electrode film 16 is formed in a rectangular shape in planar view and arranged at one end portion side of the substrate 2. The multiple first extraction electrode films 17 are extracted linearly from the first pad electrode film 16 along the longitudinal direction of the substrate 2 so as to cover one-on-one the four first impurity region groups 6, respectively. Each first extraction electrode film 17 covers the corresponding first impurity region group 6 at a uniform width and is formed wider than a width of the first impurity regions 8. The first extraction electrode films 17 enter the first contact holes 11 from on the insulating film 10 to come into ohmic contact with the first impurity regions 8.

The second internal electrode film 14 integrally includes a second pad electrode film 18 and multiple second extraction electrode films 19. The second pad electrode film 18 is formed in a rectangular shape in planar view and arranged at the other end portion side of the substrate 2. The multiple second extraction electrode films 19 are extracted linearly from the second pad electrode film 18 along the longitudinal direction of the substrate 2 so as to cover one-on-one the four second impurity region groups 7, respectively. Each second extraction electrode film 19 covers the corresponding second impurity region group 7 at a uniform width and is formed wider than a width of the second impurity regions 9. The second extraction electrode films 19 enter the second contact holes 12 from on the insulating film 10 to come into ohmic contact with the second impurity regions 9.

The first extraction electrode films 17 and the second extraction electrode films 19 are formed in a comb-teeth shape to engage each other. The first extraction electrode films 17 and the second extraction electrode films 19 are electrically insulated by a slit 15 bordering their peripheral edge portions. The first internal electrode film 13 and the second internal electrode film 14 may contain aluminum as their electrode material.

Referring to FIG. 3, in this preferred embodiment, no first contact hole 11 is formed in portions corresponding to the three first impurity regions 8 arranged in the first column of the second row, the fourth column of the sixth row, and the fourth column of the eighth row. These three first impurity regions 8 face the respective first extraction electrode films 17 through the insulating film 10. These three first impurity regions 8 are electrically insulated from the first external electrode 4 and the second external electrode 5. These three first impurity regions 8 are formed as dummy diodes $D_D$ that do not serve as the first Zener diodes $D_1$.

Similarly, no second contact hole 12 is formed in portions corresponding to the three second impurity regions 9 arranged in the first column of the first row, the first column of the third row, and the fourth column of the seventh row. These three second impurity regions 9 face the respective second extraction electrode films 19 through the insulating film 10. These three second impurity regions 9 are electrically insulated from the first external electrode 4 and the second external electrode 5. These three second impurity regions 9 are formed as dummy diodes $D_D$ that do not serve as the second Zener diodes $D_2$.

The number of dummy diodes $D_D$ is adjustable depending on the presence of the first contact holes 11 and the second contact holes 12. Adjusting the number of dummy diodes $D_D$ allows for fine adjustment of the inter-terminal capacity between the first external electrode 4 and the second external electrode 5, for example. In an aspect of this preferred embodiment, six dummy diodes $D_D$ are formed. The number of dummy diodes $D_D$ is optional and the bidirectional Zener diode 1 may employ a structure with no dummy diode $D_D$.

The sizes of the first impurity regions 8, the second impurity regions 9, the first contact holes 11, the second contact holes 12, the slit 15, the first extraction electrode films 17, and the second extraction electrode films 19 will be supplementarily described.

The first impurity regions 8 have a width of, for example, equal to or greater than 1.0 µm and equal to or smaller than 15 µm along the lateral direction of the substrate 2 and a width of, for example, equal to or greater than 20 µm and equal to or smaller than 40 µm along the longitudinal direction of the substrate 2. A width between two of the first impurity regions 8 adjacent along the longitudinal direction of the substrate 2 is, for example, equal to or greater than 5.0 µm and equal to or smaller than 25 µm. Similarly, the second impurity regions 9 have a width of, for example, equal to or greater than 1.0 µm and equal to or smaller than 15 µm along the lateral direction of the substrate 2 and a width of, for example, equal to or greater than 20 µm and equal to or smaller than 40 µm along the longitudinal direction of the substrate 2. A width between two of the second impurity regions 9 adjacent along the longitudinal direction of the substrate 2 is, for example, equal to or greater than 5.0 µm and equal to or smaller than 25 µm.

The first contact holes 11 and the second contact holes 12 have a width of, for example, equal to or greater than 1.0 µm and equal to or smaller than 15 µm along the lateral direction of the substrate 2 and a width of, for example, equal to or greater than 20 µm and equal to or smaller than 40 µm along the longitudinal direction of the substrate 2. The slit 15 has a width of, for example, equal to or greater than 1.0 µm and equal to or smaller than 3.0 µm. The first extraction electrode films 17 and the second extraction electrode films 19 have a width of, for example, equal to or greater than 10 µm and equal to or smaller than 20 µm along the lateral direction of the substrate 2.

Figure 4:
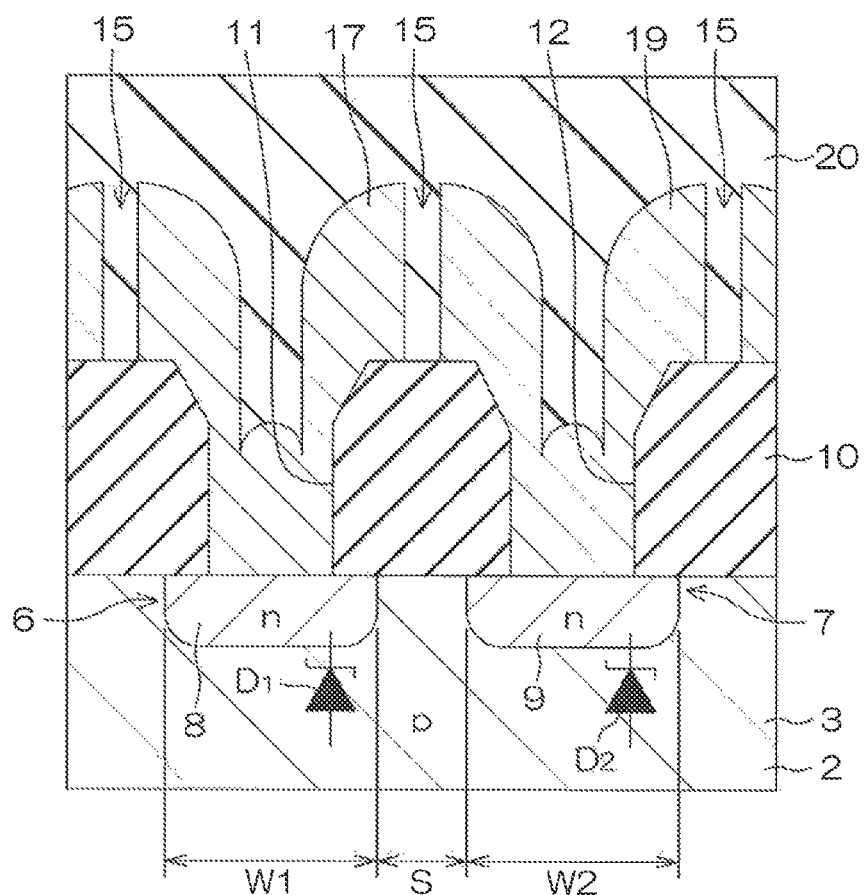
FIG. 4 is an enlarged vertical cross-sectional view along IV-IV line in FIG. 3, showing a portion in which impurity regions and extraction electrodes are formed.

FIG. 4 is an enlarged vertical cross-sectional view along IV-IV line in FIG. 3, showing a portion in which one of the first impurity regions 8, one of the second impurity regions 9, one of the first extraction electrode films 17, and one of the second extraction electrode films 19 are formed.

Referring to FIG. 4, the bidirectional Zener diode 1 according to this preferred embodiment is characterized in that a dimension S of the base region 3 along the surface of the substrate 2 between the first impurity region 8 and the second impurity region 9 is equal to or greater than 4.0 µm and equal to or smaller than 12.5 µm. The dimension S of the base region 3 along the surface of the substrate 2 will hereinafter be referred to simply as "the dimension S of the base region 3." In the bidirectional Zener diode 1 according to this preferred embodiment, the dimension S of the base region 3 is equal to or greater than 4.0 µm and equal to or smaller than 12.5 µm to achieve good current-voltage characteristic. In the bidirectional Zener diode 1 according to this preferred embodiment, a width $W_1$ of the first impurity region 8 along the lateral direction of the substrate 2 and a width $W_2$ of the second impurity region 9 along the lateral direction of the substrate 2 are both set to be equal to or greater than 1.0 µm and equal to or smaller than 9.0 µm.

Five evaluation devices shown in FIGS. 5A to 5E were prepared to investigate the current-voltage characteristics. FIGS. 5A to 5E are plan views of first to fifth evaluation devices TEG1 to TEG5 by which the current-voltage characteristics are to be evaluated. FIGS. 5A to 5E correspond to the plan view of FIG. 3.

Figure 5A:
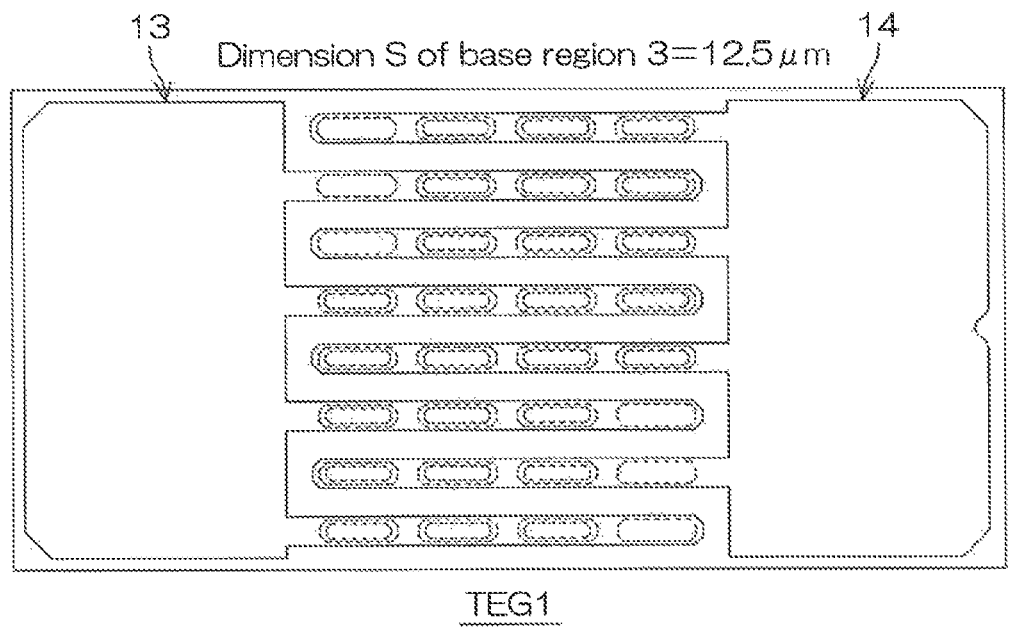
FIG. 5A is a plan view of a first evaluation device for which a current-voltage characteristic is to be evaluated.

The first evaluation device TEG1 shown in FIG. 5A is the bidirectional Zener diode 1 in which the dimension S of the base region 3 is set to 12.5 µm (dimension S=12.5 µm).

Figure 5B:
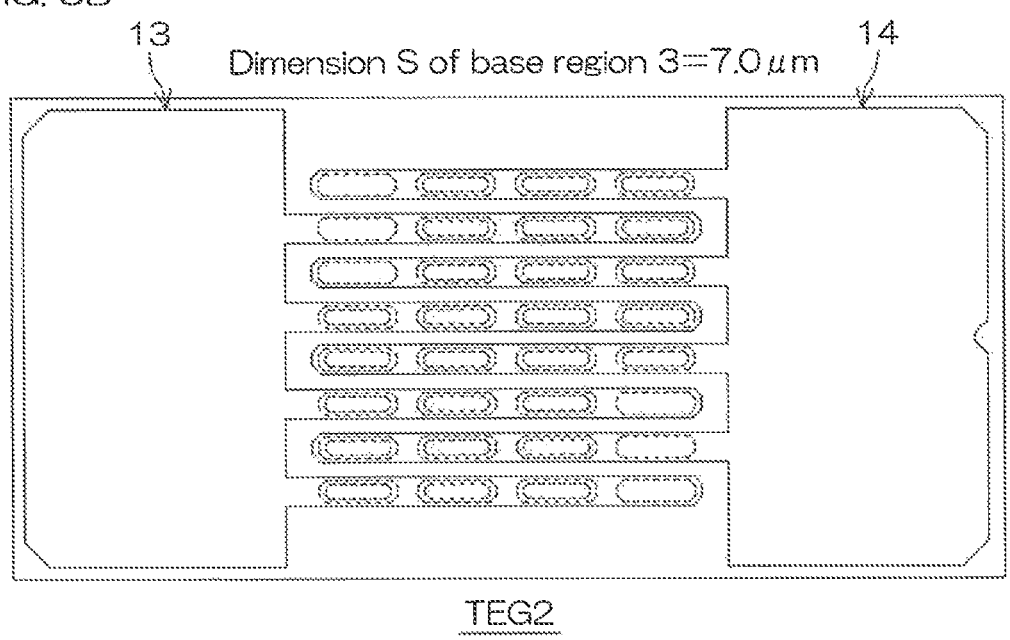
FIG. 5B is a plan view of a second evaluation device for which a current-voltage characteristic is to be evaluated.

The second evaluation device TEG2 shown in FIG. 5B is the bidirectional Zener diode 1 in which the dimension S of the base region 3 is set to 7.0 µm (dimension S=7.0 µm).

Figure 5C:
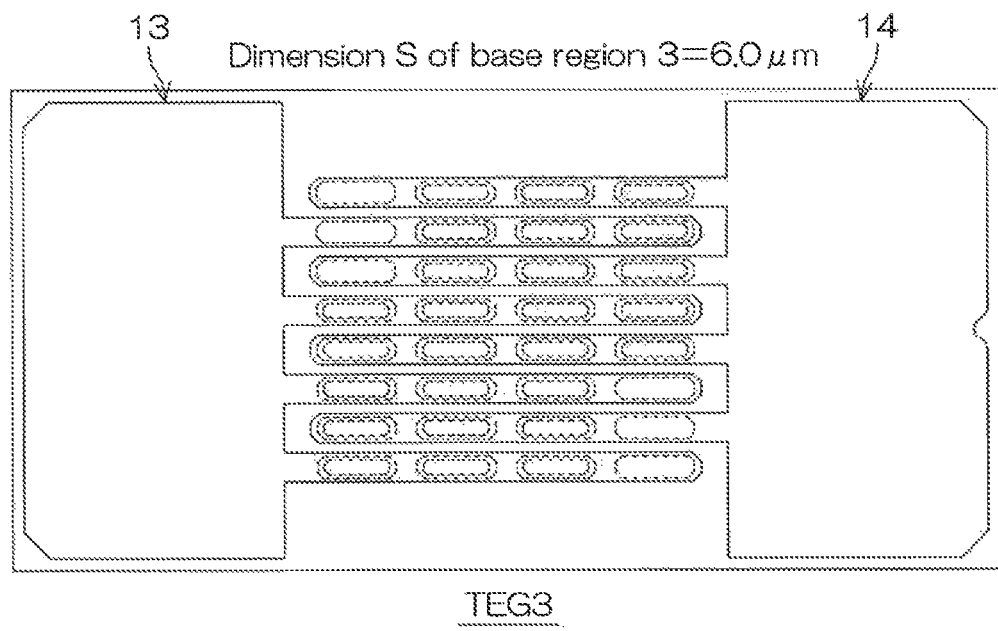
FIG. 5C is a plan view of a third evaluation device for which a current-voltage characteristic is to be evaluated.

The third evaluation device TEG3 shown in FIG. 5C is the bidirectional Zener diode 1 in which the dimension S of the base region 3 is set to 6.0 µm (dimension S=6.0 µm).

Figure 5D:
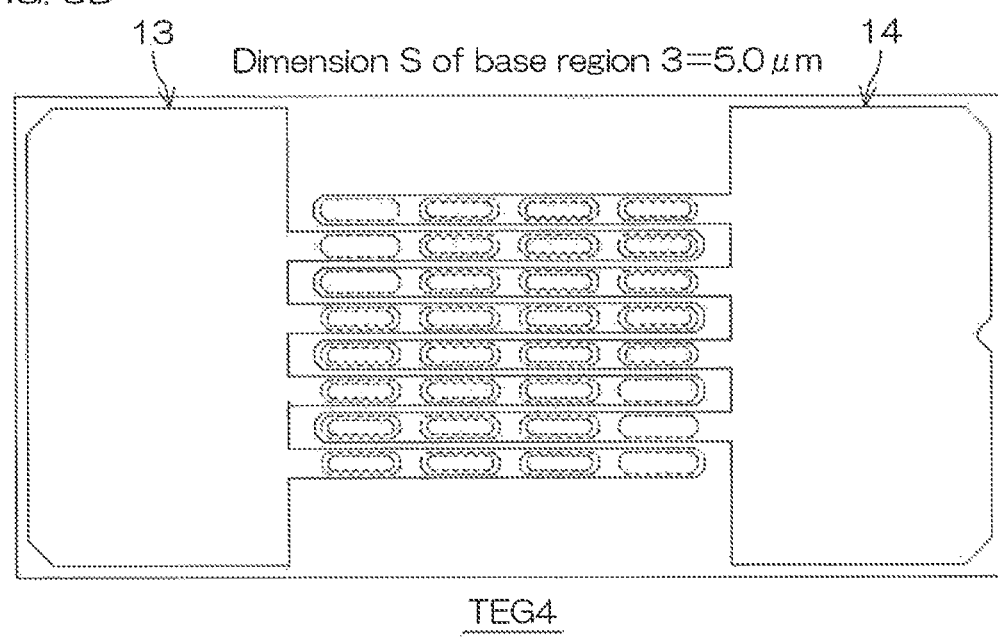
FIG. 5D is a plan view of a fourth evaluation device for which a current-voltage characteristic is to be evaluated.

The fourth evaluation device TEG4 shown in FIG. 5D is the bidirectional Zener diode 1 in which the dimension S of the base region 3 is set to 5.0 µm (dimension S=5.0 µm).

Figure 5E:
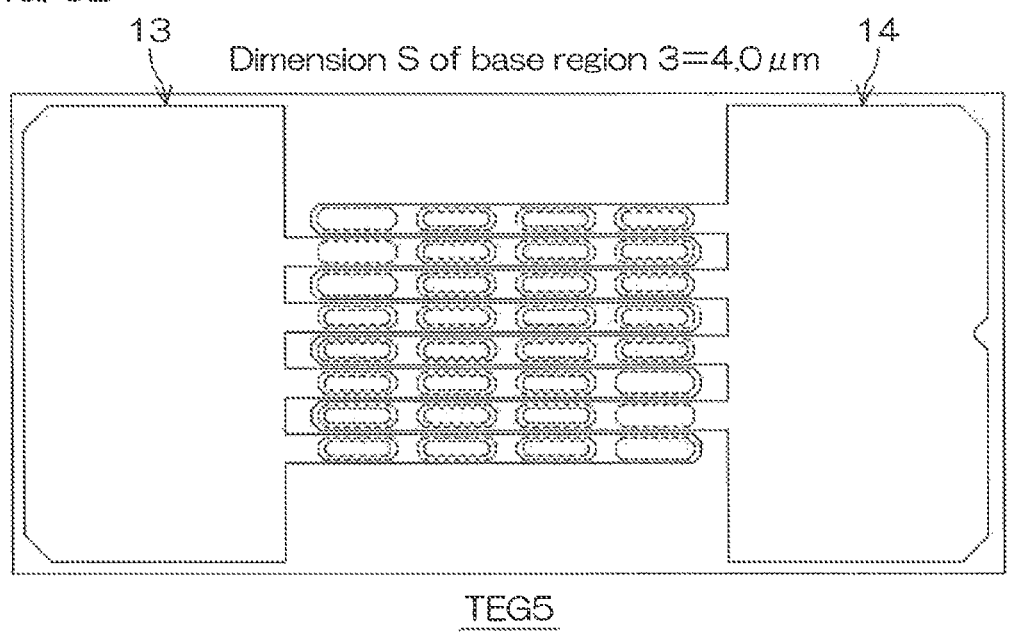
FIG. 5E is a plan view of a fifth evaluation device for which a current-voltage characteristic is to be evaluated.

The fifth evaluation device TEG5 shown in FIG. 5E is the bidirectional Zener diode 1 in which the dimension S of the base region 3 is set to 4.0 µm (dimension S=4.0 µm).

Figure 6:
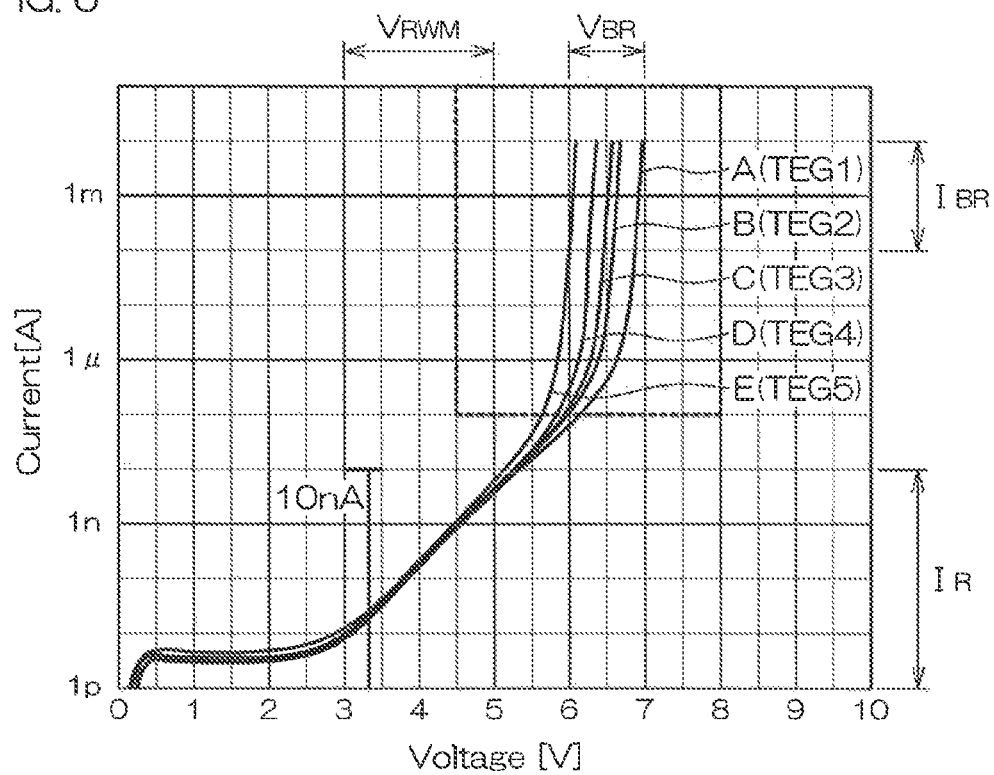
FIG. 6 is a graph showing the current-voltage characteristics of the evaluation devices shown in FIGS. 5A to 5E.
Figure 7:
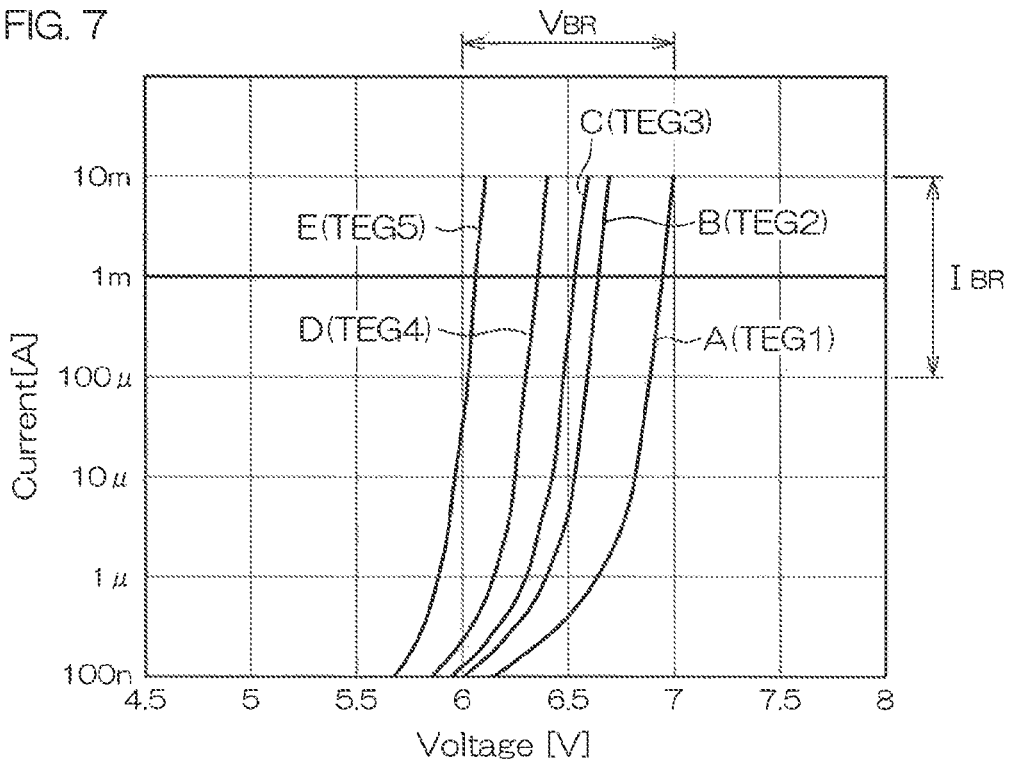
FIG. 7 is an enlarged graph of a portion surrounded by a broken line in FIG. 6.

FIG. 6 is a graph showing the current-voltage characteristics of the first to fifth evaluation devices TEG1 to TEG5 shown in FIGS. 5A to 5E. FIG. 7 is an enlarged graph of a portion surrounded by a broken line in FIG. 6.

In FIGS. 6 and 7, a vertical axis represents the current value between the first external electrode 4 and the second external electrode 5, while a horizontal axis represents the voltage value between the first external electrode 4 and the second external electrode 5. The graphs shown in FIGS. 6 and 7 represent, as current-voltage characteristics, measurements of the voltage between the first external electrode 4 and the second external electrode 5 when a current of 0 A to 10 mA flows between the first external electrode 4 and the second external electrode 5. The current-voltage characteristics are as indicated by the curves A to E.

The curve A indicates the current-voltage characteristic of the first evaluation device TEG1. The curve B indicates the current-voltage characteristic of the second evaluation device TEG2. The curve C indicates the current-voltage characteristic of the third evaluation device TEG3. The curve D indicates the current-voltage characteristic of the fourth evaluation device TEG4. The curve E indicates the current-voltage characteristic of the fifth evaluation device TEG5.

Referring to the curves A to E, the result is that the smaller the dimension S of the base region 3, the lower a reverse breakdown voltage $V_{BR}$ becomes, while the larger the dimension S of the base region 3, the higher the reverse breakdown voltage $V_{BR}$ becomes. Specifically, it is found that the first to fifth evaluation devices TEG1 to TEG5 can achieve a reverse breakdown current $I_{BR}$ of equal to or greater than 100 µA and equal to or smaller than 10 mA and a reverse breakdown voltage $V_{BR}$ of equal to or greater than 6 V and equal to or smaller than 7 V. For example, when the reverse breakdown current $I_{BR}$ is set to 1 mA, the reverse breakdown voltage $V_{BR}$ is then equal to or greater than 6 V and equal to or smaller than 7 V.

The reverse breakdown current $I_{BR}$ is defined as a current at which Zener breakdown and/or avalanche breakdown occur. The reverse breakdown voltage $V_{BR}$ is also defined as a voltage at which Zener breakdown and/or avalanche breakdown occur.

It is found that among the first to fifth evaluation devices TEG1 to TEG5, the fourth evaluation device TEG4 (the dimension S of the base region 3=5.0 µm) and the fifth evaluation device TEG5 (the dimension S of the base region 3=4.0 µm) can especially achieve the reverse breakdown current $I_{BR}$ of equal to or greater than 100 µA and equal to or smaller than 10 mA and the reverse breakdown voltage $V_{BR}$ of equal to or greater than 6 V and equal to or smaller than 6.5 V.

It is found that the first to fifth evaluation devices TEG1 to TEG5 have a reverse stand-off voltage $V_{RWM}$ within the range of 3 V to 5 V and a leakage current $I_R$ when the reverse stand-off voltage $V_{RWM}$ is applied is kept equal to or smaller than 10 nA. Specifically, it is found that the first to fifth evaluation devices TEG1 to TEG5 have the reverse stand-off voltage $V_{RWM}$ within the range of 3 V to 4 V and the leakage current $I_R$ when the reverse stand-off voltage $V_{RWM}$ is applied is kept equal to or smaller than 1 nA. For example, when the reverse stand-off voltage $V_{RWM}$ is equal to or greater than 3 V and equal to or smaller than 3.5 V, the leakage current $I_R$ when the reverse stand-off voltage $V_{RWM}$ is applied is equal to or smaller than 100 pA. The reverse stand-off voltage $V_{RWM}$ is smaller than the reverse breakdown voltage $V_{BR}$ and defined as a voltage at a stage prior to a transition to Zener breakdown and/or avalanche breakdown.

Since the dimension S of the base region 3 is thus set to be equal to or greater than 4.0 μm and equal to or smaller than 12.5 μm, the bidirectional Zener diode 1 of good current-voltage characteristics can be provided.

Referring again to FIGS. 2A and 2B, a first passivation film 20 including silicon nitride and a resin film 21 including polyimide are formed in this order on the insulating film 10 so as to cover the first internal electrode film 13 and the second internal electrode film 14. A second passivation film 22 including silicon nitride is formed on the side surface of the substrate 2. In the first passivation film 20 and the resin film 21, a first pad opening 23 which exposes the first pad electrode film 16 and a second pad opening 24 which exposes the second pad electrode film 18 are formed.

The first external electrode 4 is embedded in the first pad opening 23 so as to project from the resin film 21. The first external electrode 4 is connected electrically to the first pad electrode film 16 within the first pad opening 23. The second external electrode 5 is embedded in the second pad opening 24 so as to project from the resin film 21. The second external electrode 5 is connected electrically to the second pad electrode film 18 within the second pad opening 24. The first external electrode 4 and the second external electrode 5 may be, for example, an Ni/Pd/Au layered film having an Ni film, a Pd film formed on the Ni film, and an Au film formed on the Pd film.

Referring again to FIG. 1, on the surface of each of the first external electrode 4 and the second external electrode 5, a flat portion 30 having a rectangular shape in planar view and multiple convex portions 31 having a quadrilateral shape or a rectangular shape in planar view are formed. The flat portion 30 is a portion in which the surface of each of the first external electrode 4 and the second external electrode 5 is formed flat, and formed in a central portion on the surface of each of the first external electrode 4 and the second external electrode 5. The multiple convex portions 31 are formed around the flat portion 30 of each of the first external electrode 4 and the second external electrode 5 to form undulation in a peripheral edge portion on the surface of each of the first external electrode 4 and the second external electrode 5. The multiple convex portions 31 are each formed so as to have a surface area smaller than that of the flat portion 30. Some of the multiple convex portions 31 may be integrated with the flat portion 30.

The thus arranged first external electrode 4 and second external electrode 5 can successfully and irregularly reflect light applied on the surface of each of the first external electrode 4 and the second external electrode 5. This allows the first external electrode 4 and the second external electrode 5 to be identified successfully, whereby the two sides of the bidirectional Zener diode 1 can be discerned easily. In addition, when conducting an electrical test, it is possible to press the tip end portion of a probe against the flat portion 30 of each of the first external electrode 4 and the second external electrode 5 to thereby measure the electrical properties of the bidirectional Zener diode 1 successfully.

Moreover, the convex and recessed portions formed on the surface of each of the first external electrode 4 and the second external electrode 5 allows the surface area of each of the first external electrode 4 and the second external electrode 5 to be increased. This allows, when the bidirectional Zener diode 1 is mounted on a mounting board via a joint material such as solder, the contact area between the surface of each of the first external electrode 4 and the second external electrode 5 and the joint material to be increased. It is therefore possible to mount the bidirectional Zener diode 1 on the mounting board successfully.

As described above, in this preferred embodiment, the dimension S of the base region 3 is set to be equal to or greater than 4.0 μm and equal to or smaller than 12.5 μm. This allows for achieving the reverse breakdown current $I_{BR}$ of equal to or greater than 100 μA and equal to or smaller than 10 mA and the reverse breakdown voltage $V_{BR}$ of equal to or greater than 6 V and equal to or smaller than 7 V. In particular, setting the dimension S of the base region 3 to be equal to or greater than 4.0 μm and equal to or smaller than 5.0 μm allows for achieving the reverse breakdown voltage $V_{BR}$ of equal to or greater than 6 V and equal to or smaller than 6.5 V. Further, when the dimension S of the base region 3 is equal to or greater than 4.0 μm and equal to or smaller than 12.5 μm, it is possible to achieve the reverse stand-off voltage $V_{RWM}$ of equal to or greater than 3 V and equal to or smaller than 4 V and the leakage current $I_R$ of equal to or smaller than 1 nA.

Furthermore, in this preferred embodiment, it is only required to form, in the surficial portion of the base region 3, the first impurity regions 8 and the second impurity regions 9 in a manner spaced apart from each other, which allows a relatively simple structure to be achieved. Accordingly, no complicated process is required for the formation of the pn junctions and thereby cost increases can be suppressed.

Figure 8:
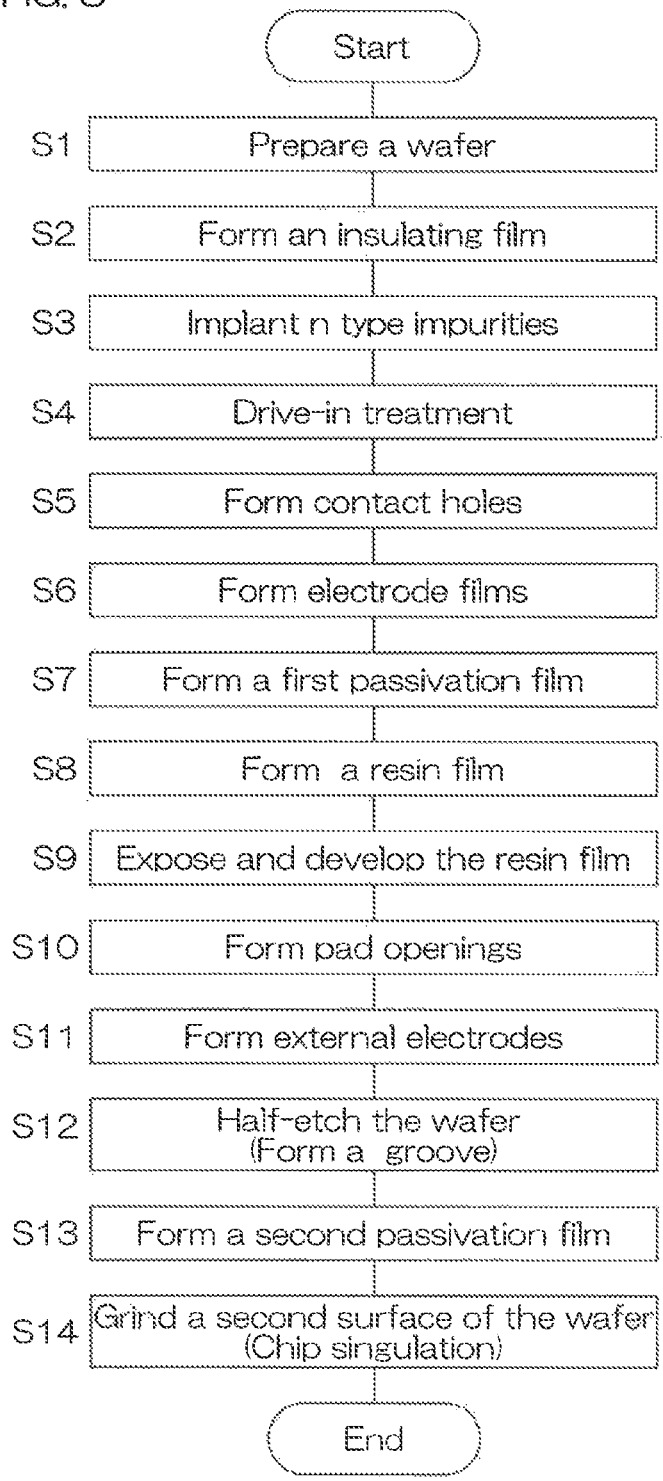
FIG. 8 is a flowchart for illustrating an exemplary process of manufacturing the bidirectional Zener diode shown in FIG. 1.

FIG. 8 is a flowchart for illustrating an exemplary process of manufacturing the bidirectional Zener diode 1 shown in FIG. 1.

First, a disk-shaped wafer is prepared as a source of the substrate 2 (Step S1). Multiple chip regions correspond to the bidirectional Zener diode 1 are set on the surface of the wafer. Next, the insulating film 10 is formed on the surface of the wafer through a thermal oxidation treatment, for example (Step S2).

Next, n type impurities are implanted into regions in which the first impurity regions 8 are to be formed and regions in which the second impurity regions 9 are to be formed in a surficial portion of the wafer (Step S3). Next, a heat treatment (drive-in treatment) is conducted to diffuse the n type impurities implanted into the wafer and thereby to form the first impurity regions 8 and the second impurity regions 9 (Step S4). The reverse breakdown voltage $V_{BR}$ of the bidirectional Zener diode 1 varies depending on the temperature and duration of this heat treatment. Investigation results of how the reverse breakdown voltage $V_{BR}$ varies depending on the conditions of the heat treatment are shown in FIG. 9.

Figure 9:
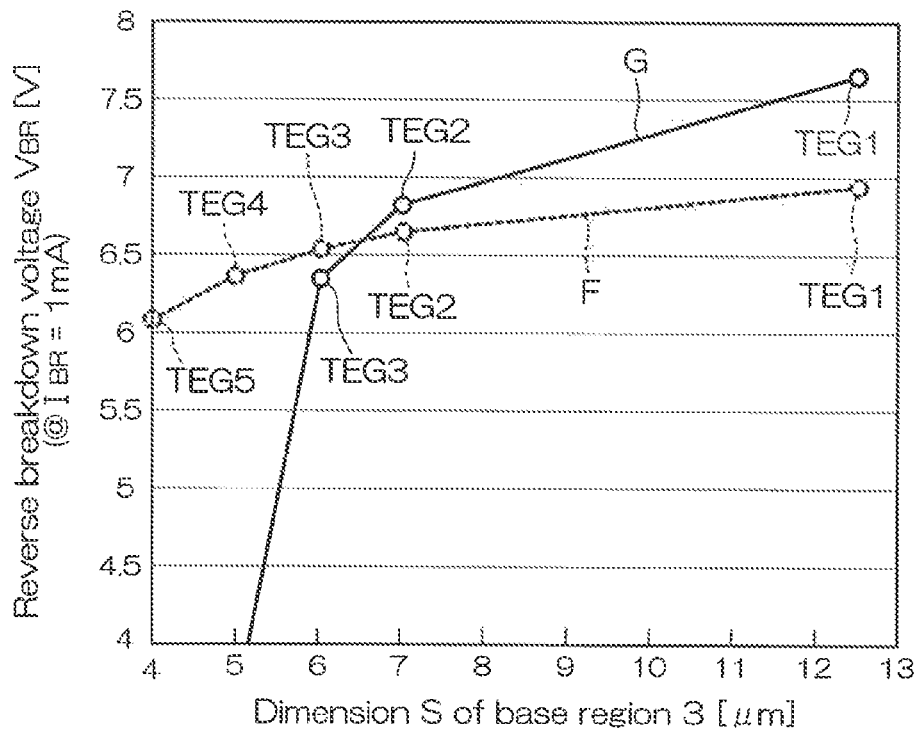
FIG. 9 is a graph for illustrating characteristics regarding adjustment of reverse breakdown voltages of the evaluation devices shown in FIGS. 5A to 5E.

FIG. 9 is a graph for illustrating characteristics regarding adjustment of the reverse breakdown voltage $V_{BR}$ of the first to fifth evaluation devices TEG1 to TEG5 shown in FIGS. 5A to 5E. In FIG. 9, a vertical axis represents the reverse breakdown voltage $V_{BR}$, while a horizontal axis represents the dimension S of the base region 3. In FIG. 9, a polygonal line F indicated by a broken line and a polygonal line G indicated by a solid line both indicate the reverse breakdown voltage $V_{BR}$ of the first to fifth evaluation devices TEG1 to TEG5 when the reverse breakdown current $I_{BR}$ is 1 mA.

The polygonal line F indicates the reverse breakdown voltage $V_{BR}$ when the n type impurities are diffused through a low-temperature process in which a relatively small amount of heat is applied to the wafer. The polygonal line F is a graph of the relationship between the reverse breakdown voltage $V_{BR}$ and the dimension S of the base region 3 of the first to fifth evaluation devices TEG1 to TEG5 shown in FIGS. 6 and 7 above.

In the low-temperature process, the temperature of the heat treatment is, for example, equal to or higher than 900° C. and equal to or lower than 1100° C., and the duration of the heat treatment is, for example, equal to or longer than 20 seconds and equal to or shorter than 60 minutes. When the temperature of the heat treatment is equal to or higher than 900° C. and equal to or lower than 1000° C., the duration of the heat treatment may be equal to or longer than 30 minutes and equal to or shorter than 60 minutes. When the temperature of the heat treatment is higher than 1000° C. and equal to or lower than 1100° C., the duration of the heat treatment may be equal to or longer than 20 seconds and equal to or shorter than 30 minutes.

On the other hand, the polygonal line G indicates the reverse breakdown voltage $V_{BR}$ when the n type impurities are diffused through a high-temperature process in which a larger amount of heat than the low-temperature process is applied to the wafer. In the high-temperature process, the temperature of the heat treatment is, for example, 1200° C., and the duration of the heat treatment is, for example, about 60 minutes.

Through comparison between the polygonal line F and the polygonal line G, it is found that as the amount of heat applied to the wafer becomes larger, the reverse breakdown voltage $V_{BR}$ tends to be higher. Referring to the polygonal line G, it is found that the fourth evaluation device TEG4 and the fifth evaluation device TEG5 undergo a rapid decrease in the reverse breakdown voltage $V_{BR}$ when the high-temperature process is applied.

Figure 10:
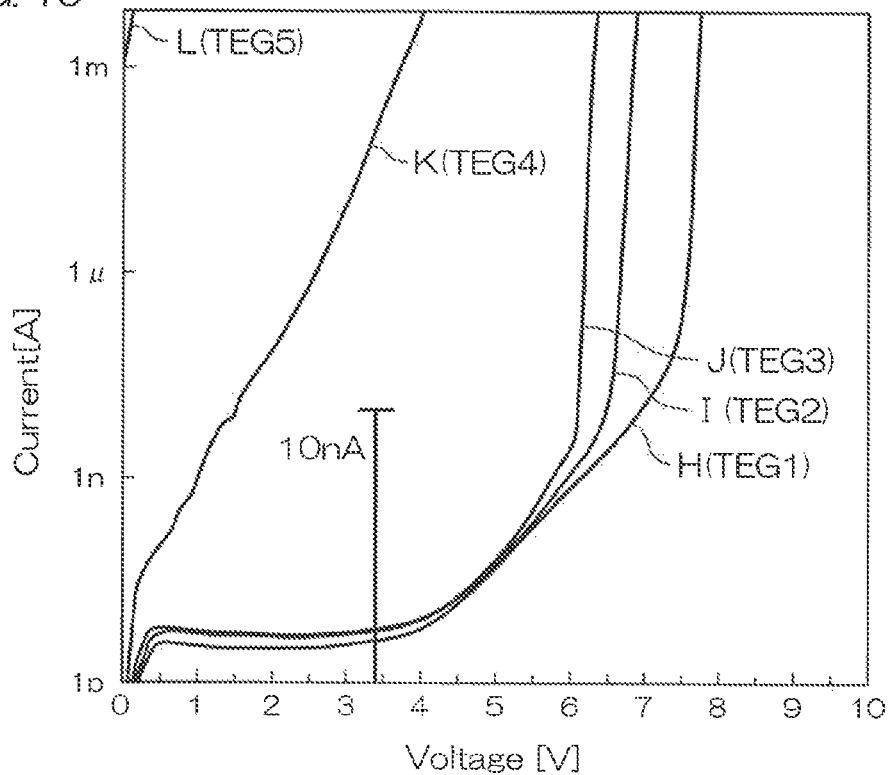
FIG. 10 is a graph showing the current-voltage characteristics of the evaluation devices shown in FIGS. 5A to 5E when a high-temperature process is applied in Step S4 of FIG. 8.

FIG. 10 is a graph showing the current-voltage characteristics of the first to fifth evaluation devices TEG1 to TEG5 shown in FIGS. 5A to 5E when a high-temperature process is applied in Step S4 of FIG. 8. FIG. 10 corresponds to FIG. 6 above.

In FIG. 10, a curve H indicates the current-voltage characteristic of the first evaluation device TEG1. A curve I indicates the current-voltage characteristic of the second evaluation device TEG2. A curve J indicates the current-voltage characteristic of the third evaluation device TEG3. A curve K indicates the current-voltage characteristic of the fourth evaluation device TEG4. A curve L indicates the current-voltage characteristic of the fifth evaluation device TEG5.

Referring to the curves K and L, the fourth evaluation device TEG4 and the fifth evaluation device TEG5, to which the high-temperature process was applied, undergo a rapid increase in the leakage current $I_R$ with a rapid decrease in the reverse breakdown voltage $V_{BR}$, resulting in a substantially normally-ON state.

In the high-temperature process, the n type impurities implanted into the wafer diffuse over a wide range. As a result, it is believed that depletion layers extending from the pn junction portions between the first impurity regions 8 and the base region 3 overlap depletion layers extending from the pn junction portions between the second impurity regions 9 and the base region 3, resulting in a state where a current flows constantly or near that and therefore there is a rapid increase in the leakage current $I_R$. It is believed that the fourth evaluation device TEG4 and the fifth evaluation device TEG5, which have the dimension S of the base region 3 of equal to or smaller than 5.0 μm, particularly face such a problem, because the dimension S of the base region 3 is relatively small.

It is therefore only required to perform the step of forming the first impurity regions 8 and the second impurity regions 9 by diffusing the n type impurities at an amount of heat at which depletion layers extending from the pn junction portions between the first impurity regions 8 and the base region 3 do not overlap depletion layers extending from the pn junction portions between the second impurity regions 9 and the base region 3. The result of performing this as a low-temperature process is indicated by the polygonal line F in FIG. 9. As understood also from FIG. 6 above, the application of the low-temperature process then allows the leakage current $I_R$ to be effectively suppressed or prevented from being increased rapidly and the bidirectional Zener diode 1 of good electrical properties can be achieved.

Referring again to FIG. 8, after the heat treatment in Step S4, the first contact holes 11 which expose the first impurity regions 8 and the second contact holes 12 which expose the second impurity regions 9 are formed in the insulating film 10 by etching via a mask, for example (Step S5). Next, a sputtering method, for example, is used to deposit Al so as to cover the insulating film 10 and thereby to form an electrode film on the insulating film 10 (Step S6). Next, the electrode film is patterned into a desired shape by etching via a mask. The first internal electrode film 13 and the second internal electrode film 14 are thus formed.

Next, a CVD method, for example, is used to deposit a nitride film so as to cover the first internal electrode film 13 and the second internal electrode film 14 and thereby to form the first passivation film 20 (Step S7). Next, photosensitive polyimide is provided on the first passivation film 20 to form the resin film 21 (Step S8). Next, the resin film 21 is developed after exposed selectively by an exposure light. Accordingly, a pattern that corresponds to the first pad opening 23 and the second pad opening 24 is formed in the resin film 21 (Step S9). Next, the resin film 21 is used as a mask to etch the first passivation film 20 and thereby to form the first pad opening 23 and the second pad opening 24 (Step S10).

Next, an Ni film, a Pd film, and an Au film are formed through plating in this order so as to fill the first pad opening 23 and the second pad opening 24 and thereby to form the first external electrode 4 and the second external electrode 5 (Step S11). Next, the wafer is half-etched so as to define the chip regions and thereby to form a groove that defines the chip regions (Step S12). Next, a CVD method, for example, is used to deposit silicon nitride on an interior surface of the groove and thereby to form the second passivation film 22 (Step S13). Next, a second surface (backside) of the wafer is ground to communicate with the groove (Step S14). This causes singulation into multiple bidirectional Zener diodes 1.

Reference Example

Figure 13:
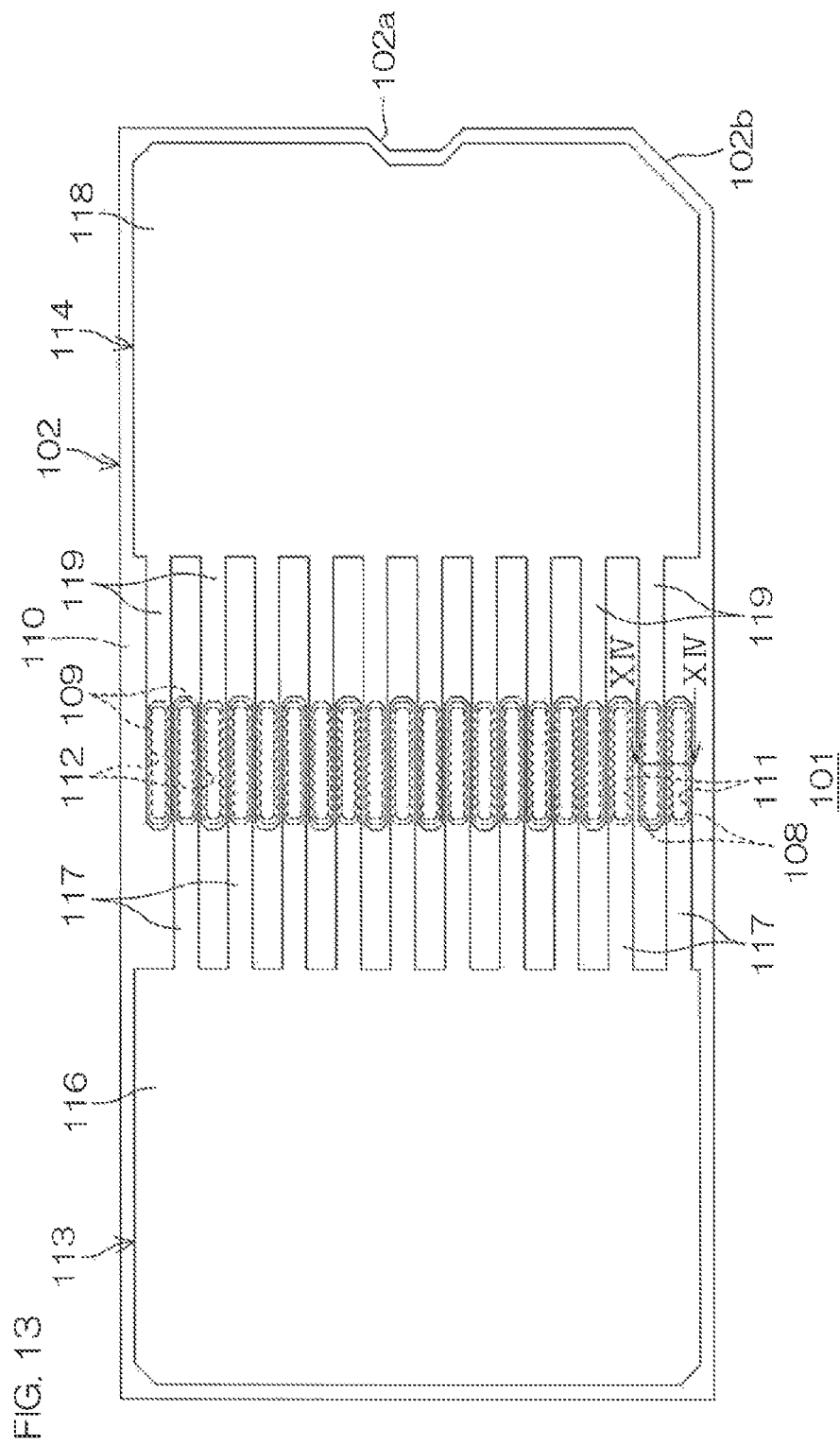
FIG. 13 is a horizontal cross-sectional view along XIII-XIII line in FIG. 12A.

FIG. 11 is a plan view of a bidirectional Zener diode 101 according to a reference example. FIG. 12A is a vertical cross-sectional view along XIIA-XIIA line in FIG. 11. FIG. 12B is a vertical cross-sectional view along XIIB-XIIB line in FIG. 11. FIG. 13 is a horizontal cross-sectional view along XIII-XIII line in FIG. 12A.

The bidirectional Zener diode 101 includes a substrate 102 having a rectangular shape in planar view. The substrate 102 may be a silicon substrate. A length $L_{11}$ of a long side along a longitudinal direction of the substrate 102 is, for example, equal to or greater than 0.3 mm and equal to or smaller than 0.6 mm. A length $D_{11}$ of a short side along a lateral direction is, for example, equal to or greater than 0.15 mm and equal to or smaller than 0.3 mm. A thickness $T_{11}$ of the substrate 102 is, for example, 0.1 mm. The substrate 102 having those sizes allows the bidirectional Zener diode 101 to be formed as a so-called chip component and thereby to be applied to various applications.

Referring to FIGS. 12A and 12B, a p type base region 103 is formed in a surficial portion of the substrate 102 so as to expose through a surface of the substrate 102. More specifically, in this reference example, p type impurities are introduced from the surface to the second surface (backside) of the substrate 102. This causes the base region 103 to be formed over the entire substrate 102 and results in an aspect in which the substrate 102 can be considered as a p type substrate. A specific resistance of the substrate 102 is around 5 mΩ·cm due to the introduction of the p type impurities.

A first external electrode 104 (first electrode) and a second external electrode 105 (second electrode) are arranged above the surface of the substrate 102. The first external electrode 104 is arranged at one end portion side of the substrate 102. The second external electrode 105 is arranged at the other end portion side of the substrate 102.

In planar view, a recessed portion 102a recessed toward an interior region of the substrate 102 is formed on an end portion of the second external electrode 105 side of the substrate 102. On the end portion, the recessed portion 102a is formed in a central portion of the lateral direction of the substrate 102. The recessed portion 102a is formed along the side surface of the substrate 102. In addition, one of the corners of the second external electrode 105 side of the substrate 102 is chamfered to be a chamfered portion 102b. Neither such a recessed portion 102a nor such a chamfered portion 102b is formed in an end portion of the first external electrode 104 side of the substrate 102. This makes the bidirectional Zener diode 101 asymmetric, offering various types of information such as mounting direction and polar direction of the bidirectional Zener diode 101.

Referring to FIGS. 12A, 12B, and 13, multiple n type first impurity regions 108 and multiple n type second impurity regions 109 are formed in a surficial portion of the base region 103 between the first external electrode 104 and the second external electrode 105. The multiple n type first impurity regions 108 are connected electrically to the first external electrode 104. The multiple n type second impurity regions 109 are connected electrically to the second external electrode 105. The first impurity regions 108 and the second impurity regions 109 are formed in a central portion along the longitudinal direction of the substrate 102 in planar view. The first impurity regions 108 and the second impurity regions 109 are adjacent in the lateral direction of the substrate 102 and arranged alternately along the lateral direction of the substrate 102.

The first impurity regions 108 and the second impurity regions 109 are formed so as to have a same depth and a same n type impurity concentration. The n type impurity concentration of each first impurity region 108 and each second impurity region 109 is, for example, equal to or greater than $1.0 \times 10^{19}$ cm$^{-3}$ and equal to or smaller than $1.0 \times 10^{21}$ cm$^{-3}$. All of the first impurity regions 108 and the second impurity regions 109 are formed so as to have a same shape and a same area in planar view. In planar view, the first impurity regions 108 and the second impurity regions 109 are each formed in a rectangular shape (a rounded-corner rectangular shape) which extends along the longitudinal direction of the substrate 102 and has the four corners being cut.

The first impurity regions 108 form pn junctions with the base region 103. A first Zener diodes $D_{11}$ is formed by the pn junction portions between the first impurity regions 108 and the base region 103. The second impurity regions 109 also form pn junctions with the base region 103. A second Zener diodes $D_{21}$ is formed by the pn junction portions between the second impurity regions 109 and the base region 103. The first Zener diodes $D_{11}$ and the second Zener diodes $D_{21}$ are connected in reverse series via the base region 103. The first impurity regions 108 and the second impurity regions 109 are formed in a manner spaced apart from each other such that depletion layers extending from the pn junction portions between the first impurity regions 108 and the base region 103 do not overlap depletion layers extending from the pn junction portions between the second impurity regions 109 and the base region 103.

Referring to FIGS. 12A and 12B, an insulating film 110 is formed on the surface of the substrate 102. The insulating film 110 is, for example, a silicon dioxide film. First contact holes 111 which expose the first impurity regions 108 and second contact holes 112 which expose the second impurity regions 109 are formed in the insulating film 110. A first internal electrode film 113 and a second internal electrode film 114 are formed on the insulating film 110.

The first internal electrode film 113 integrally includes a first pad electrode film 116 and multiple first extraction electrode films 117. The first pad electrode film 116 is formed in a rectangular shape in planar view and arranged at one end portion side of the substrate 102. The multiple first extraction electrode films 117 are extracted linearly from the first pad electrode film 116 along the longitudinal direction of the substrate 102 so as to cover one-on-one the multiple first impurity regions 108, respectively. Each first extraction electrode film 117 covers the corresponding first impurity region 108 at a uniform width and is formed wider than a width of the first impurity region 108. Each first extraction electrode film 117 enters the corresponding first contact hole 111 from on the insulating film 110 to come into ohmic contact with the corresponding first impurity region 108.

The second internal electrode film 114 integrally includes a second pad electrode film 118 and multiple second extraction electrode films 119. The second pad electrode film 118 is formed in a rectangular shape in planar view and arranged at the other end portion side of the substrate 102. The second pad electrode film 118 has portions following the recessed portion 102a and the chamfered portion 102b of the substrate 102 and forms an asymmetric pair with the first pad electrode film 116.

The multiple second extraction electrode films 119 are extracted linearly from the second pad electrode film 118 along the longitudinal direction of the substrate 102 so as to cover one-on-one the multiple second impurity regions 109, respectively. Each second extraction electrode film 119 covers the corresponding second impurity region 109 at a uniform width and is formed wider than a width of the second impurity region 109. Each second extraction electrode film 119 enters the corresponding second contact hole 112 from on the insulating film 110 to come into ohmic contact with the corresponding second impurity region 109.

The first extraction electrode films 117 and the second extraction electrode films 119 are formed in a comb-teeth shape to engage each other. The first extraction electrode films 117 and the second extraction electrode films 119 are electrically insulated by a slit 115 bordering their peripheral edge portions. The first internal electrode film 113 and the second internal electrode film 114 may contain aluminum as their electrode material.

Figure 14:
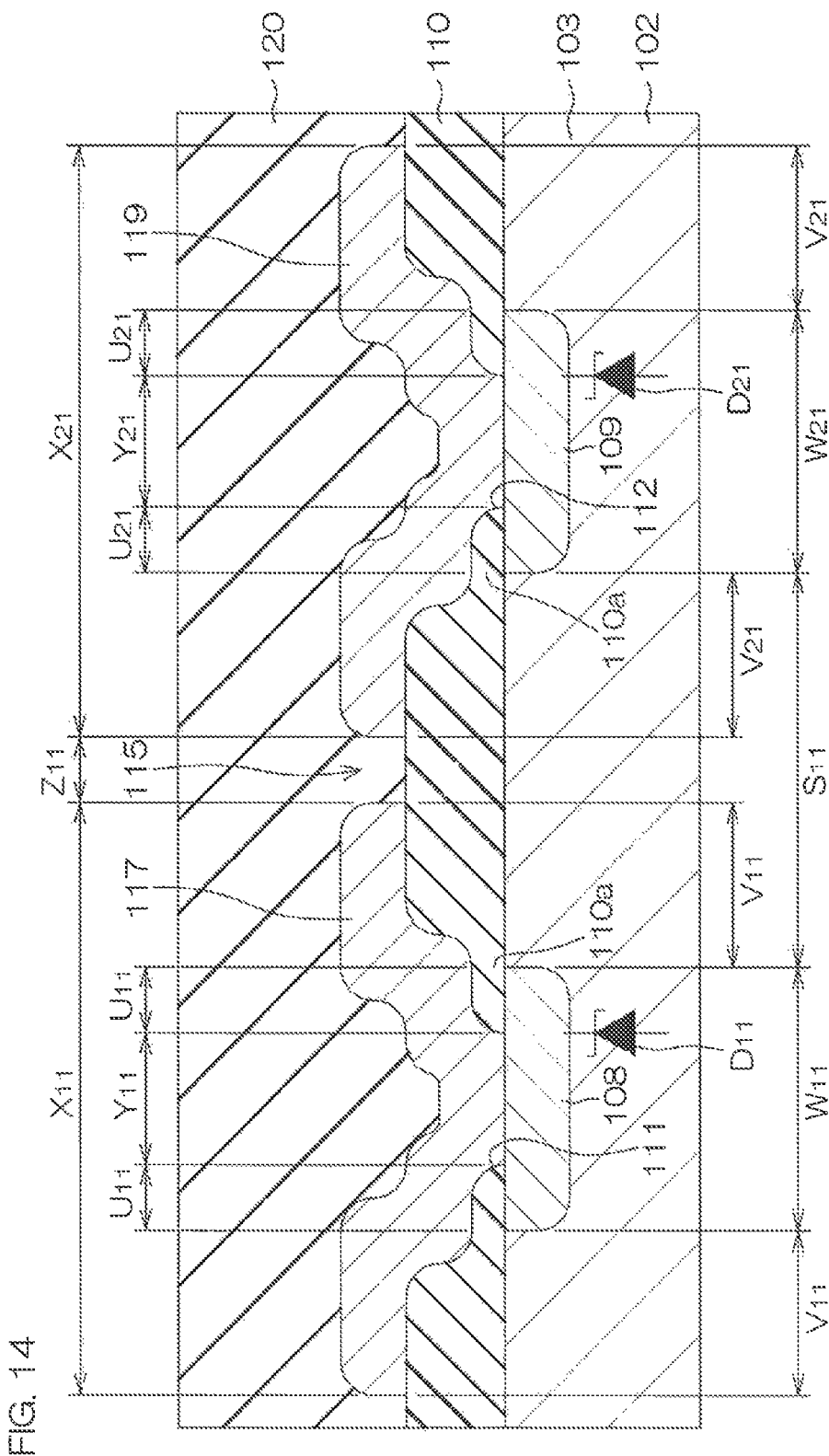
FIG. 14 is an enlarged vertical cross-sectional view along XIV-XIV line in FIG. 13, showing a portion in which impurity regions and extraction electrodes are formed.

FIG. 14 is an enlarged vertical cross-sectional view along XIV-XIV line in FIG. 13, showing a portion in which one of the first impurity regions 108, one of the second impurity regions 109, one of the first extraction electrode films 117, and one of the second extraction electrode films 119 are formed.

Referring to FIG. 14, the insulating film 110 includes thin-film portions 110a thinned in portions covering the first impurity region 108 and the second impurity region 109. The first contact hole 111 and the second contact hole 112 are formed in these thin-film portions 110a.

The bidirectional Zener diode 101 according to this reference example is characterized in that a width $W_{11}$ of the first impurity region 108 along the lateral direction of the substrate 102 (hereinafter referred to simply as "the width $W_{11}$ of the first impurity region 108") and/or a width $W_{21}$ of the second impurity region 109 along the lateral direction of the substrate 102 (hereinafter referred to simply as "the width $W_{21}$ of the second impurity region 109") are set to be equal to or greater than 1.0 μm and equal to or smaller than 9.0 μm.

In the bidirectional Zener diode 101 according to this reference example, the width $W_{11}$ of the first impurity region 108 and the width $W_{21}$ of the second impurity region 109 are both set to be equal to or greater than 1.0 μm and equal to or smaller than 9.0 μm. The bidirectional Zener diode 101 according to this reference example provides good current-voltage characteristic by setting the width $W_{11}$ of the first impurity region 108 and the width $W_{21}$ of the second impurity region 109 to be equal to or greater than 1.0 μm and equal to or smaller than 9.0 μm. A width of the first impurity region 108 along the longitudinal direction of the substrate 102 and a width of the second impurity region 109 along the longitudinal direction of the substrate 102 may be set to be equal to or greater than 20 μm and equal to or smaller than 40 μm.

The sizes of the first contact holes 111, the second contact holes 112, the slit 115, the first extraction electrode films 117, and the second extraction electrode films 119 will be supplementarily described with reference to FIG. 14.

A width $Y_{11}$ of the first contact hole 111 along the lateral direction of the substrate 102 and a width $Y_{21}$ of the second contact hole 112 along the lateral direction of the substrate 102 are, for example, equal to or greater than 1.0 μm and equal to or smaller than 9.0 μm. A width of the first contact hole 111 along the longitudinal direction of the substrate 102 and a width of the second contact hole 112 along the longitudinal direction of the substrate 102 are, for example, equal to or greater than 20 μm and equal to or smaller than 40 μm. A width $Z_{11}$ of the slit 115 is, for example, equal to or greater than 1.0 μm and equal to or smaller than 3.0 μm. A width $X_{11}$ of the first extraction electrode film 117 along the lateral direction of the substrate 102 and a width $X_{21}$ of the second extraction electrode film 119 along the lateral direction of the substrate 102 are, for example, equal to or greater than 1.0 μm and equal to or smaller than 15 μm.

A distance $U_{11}$ between a peripheral edge portion of a first impurity region 108 and the peripheral edge portion of the first contact hole 111 ($U_{11}=(W_{11}-Y_{11})/2$) is equal to or greater than 0 μm and equal to or smaller than 3.0 μm. Similarly, a distance $U_{21}$ between a peripheral edge portion of the second impurity region 109 and a peripheral edge portion of the second contact hole 112 ($U_{21}=(W_{21}-Y_{21})/2$) is equal to or greater than 0 μm and equal to or smaller than 3.0 μm.

A distance $V_{11}$ between a peripheral edge portion of the first impurity region 108 and a peripheral edge portion of the first extraction electrode film 117 ($V_{11}=(X_{11}-W_{11})/2$) is equal to or greater than 1.0 μm and equal to or smaller than 2.0 μm. Similarly, a distance $V_{21}$ between a peripheral edge portion of the second impurity region 109 and a peripheral edge portion of the second extraction electrode film 119 ($V_{21}=(X_{21}-W_{21})/2$) is equal to or greater than 1.0 μm and equal to or smaller than 2.0 μm. A dimension $S_{11}$ of the base region 103 along the surface of the substrate 102 between the first impurity region 108 and the second impurity region 109 (hereinafter referred to simply as "the dimension $S_{11}$ of the base region 103") is preferably set to be equal to or greater than 4.0 μm and equal to or smaller than 12.5 μm.

As shown in FIG. 15, 18 evaluation devices with the width $W_{11}$ of the first impurity regions 108 and the width $W_{21}$ of the second impurity regions 109 set to a value equal to or greater than 1.0 μm and equal to or smaller than 9.0 μm are prepared to investigate the current-voltage characteristic of the bidirectional Zener diode 101.

FIG. 15 is a table showing the dimensions of the first to sixth evaluation devices TEG201 to TEG206 for which the current-voltage characteristics are to be evaluated. FIGS. 16A to 16F are plan views of the first to sixth evaluation devices TEG201 to TEG206 for which the current-voltage characteristics are to be evaluated. Since the configuration on the side of each first impurity region 108 and the configuration on the side of each second impurity region 109 are approximately the same, the sizes of the second impurity region 109 side are omitted in FIG. 15. FIGS. 16A to 16F correspond to the plan view of FIG. 13.

As shown in FIG. 15, the 18 evaluation devices are classified roughly into six first to sixth evaluation devices TEG201 to TEG206.

Referring to FIG. 15, the first evaluation device TEG201 is the bidirectional Zener diode 101 in which the width $W_{11}$ of the first impurity regions 108 and the width $W_{21}$ of the second impurity regions 109 are both set to 1.0 μm (widths $W_{11}$, $W_{21}=1.0$ μm). The dimension $S_{11}$ of the base region 103 is set to 4.0 μm ($=2\times V_{11}+Z_{11}$). Referring to FIG. 16A, the first evaluation device TEG201 includes 26 first impurity regions 108 and 26 second impurity regions 109.

Figure 16B:
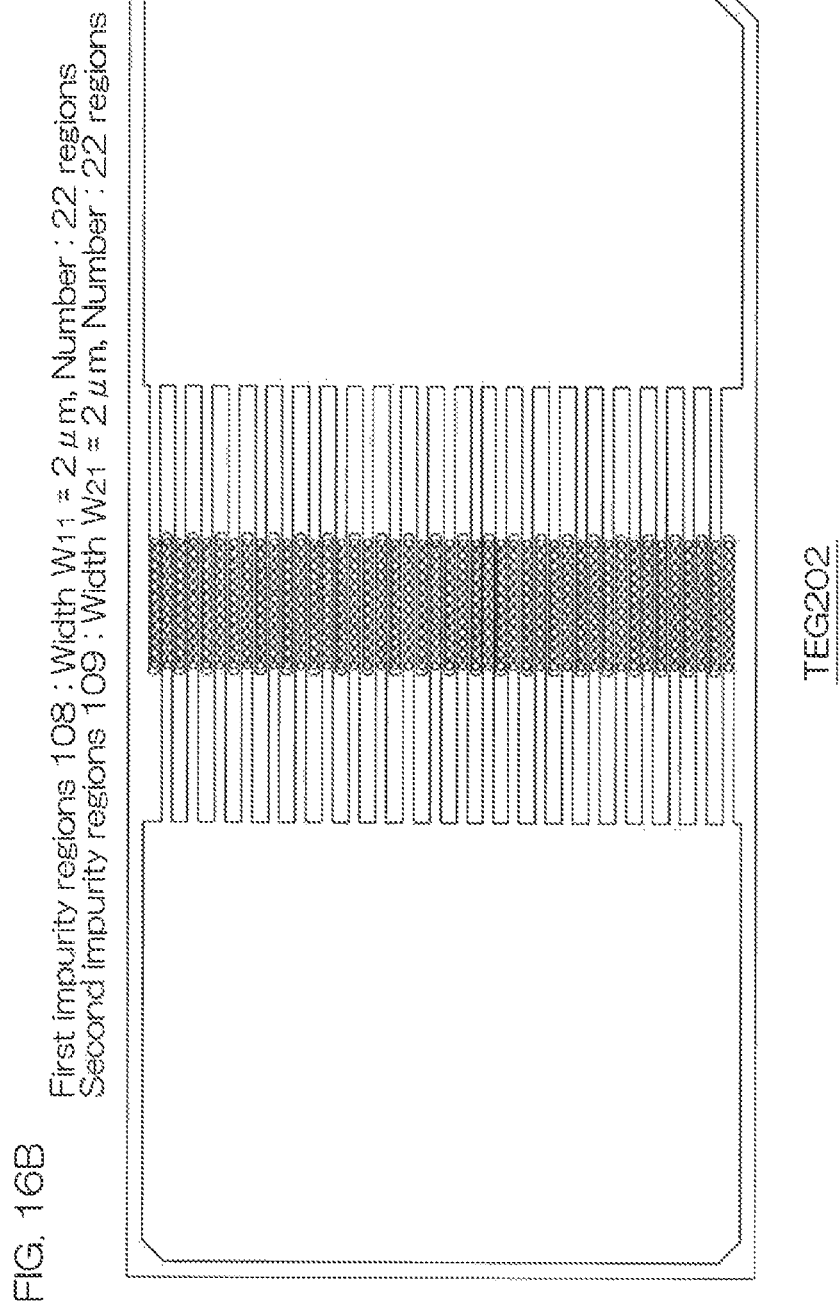
FIG. 16B is a plan view of a second evaluation device for which a current-voltage characteristic is to be evaluated.

Referring to FIG. 15, the second evaluation device TEG202 is the bidirectional Zener diode 101 in which the width $W_{11}$ of the first impurity regions 108 and the width $W_{21}$ of the second impurity regions 109 are both set to 2.0 μm (widths $W_{11}$, $W_{21}=2.0$ μm). The dimension $S_{11}$ of the base region 103 is set to 4.0 μm. The second evaluation device TEG202 includes a second evaluation device TEG202A, a second evaluation device TEG202B, and a second evaluation device TEG202C in which the width $Y_{11}$ of the first contact holes 111 and the width $Y_{21}$ of the second contact holes 112 are set to 1.0 μm, 1.4 μm, and 2.0 μm, respectively. Referring to FIG. 16B, the second evaluation device TEG202 includes 22 first impurity regions 108 and 22 second impurity regions 109.

Referring to FIG. 15, the third evaluation device TEG203 is the bidirectional Zener diode 101 in which the width $W_{11}$ of the first impurity regions 108 and the width $W_{21}$ of the second impurity regions 109 are both set to 3.0 μm (widths $W_{11}$, $W_{21}=3.0$ μm). The dimension $S_{11}$ of the base region 103 is set to 4.0 μm. The third evaluation device TEG203 includes a third evaluation device TEG203A, a third evaluation device TEG203B, and a third evaluation device TEG203C in which the width $Y_{11}$ of the first contact holes 111 and the width $Y_{21}$ of the second contact holes 112 are set to 1.0 µm, 2.0 µm, and 3.0 µm, respectively. Referring to FIG. 16C, the third evaluation device TEG203 includes 19 first impurity regions 108 and 19 second impurity regions 109.

Referring to FIG. 15, the fourth evaluation device TEG204 is the bidirectional Zener diode 101 in which the width $W_{11}$ of the first impurity regions 108 and the width $W_{21}$ of the second impurity regions 109 are both set to 5.0 µm (widths $W_{11}$, $W_{21}$=5.0 µm). The dimension $S_{11}$ of the base region 103 is set to 4.0 µm. The fourth evaluation device TEG204 includes a fourth evaluation device TEG204A, a fourth evaluation device TEG204B, and a fourth evaluation device TEG204C in which the width $Y_{11}$ of the first contact holes 111 and the width $Y_{21}$ of the second contact holes 112 are set to 1.0 µm, 3.0 µm, and 5.0 µm, respectively. Referring to FIG. 16D, the fourth evaluation device TEG204 includes 14 first impurity regions 108 and 14 second impurity regions 109.

Referring to FIG. 15, the fifth evaluation device TEG205 is the bidirectional Zener diode 101 in which the width $W_{11}$ of the first impurity regions 108 and the width $W_{21}$ of the second impurity regions 109 are both set to 7.0 µm (widths $W_{11}$, $W_{21}$=7.0 µm). The dimension $S_{11}$ of the base region 103 is set to 4.0 µm. The fifth evaluation device TEG205 includes a fifth evaluation device TEG205A, a fifth evaluation device TEG205B, and a fifth evaluation device TEG205C in which the width $Y_{11}$ of the first contact holes 111 and the width $Y_{21}$ of the second contact holes 112 are set to 2.0 µm, 4.0 µm, and 7.0 µm, respectively. Referring to FIG. 16E, the fifth evaluation device TEG205 includes 12 first impurity regions 108 and 12 second impurity regions 109.

Referring to FIG. 15, the sixth evaluation device TEG206 is the bidirectional Zener diode 101 in which the width $W_{11}$ of the first impurity regions 108 and the width $W_{21}$ of the second impurity regions 109 are both set to 9.0 µm (widths $W_{11}$, $W_{21}$=9.0 µm). The dimension $S_{11}$ of the base region 103 is set to 4.0 µm. The sixth evaluation device TEG206 includes a sixth evaluation device TEG206A, a sixth evaluation device TEG206B, a sixth evaluation device TEG206C, a sixth evaluation device TEG206D, and a sixth evaluation device TEG206E in which the width $Y_{11}$ of the first contact holes 111 and the width $Y_{21}$ of the second contact holes 112 are set to 4.0 µm, 5.0 µm, 6.0 µm, 7.0 µm, and 9.0 µm, respectively. Referring to FIG. 16F, the sixth evaluation device TEG206 includes 10 first impurity regions 108 and 10 second impurity regions 109.

Figure 17:
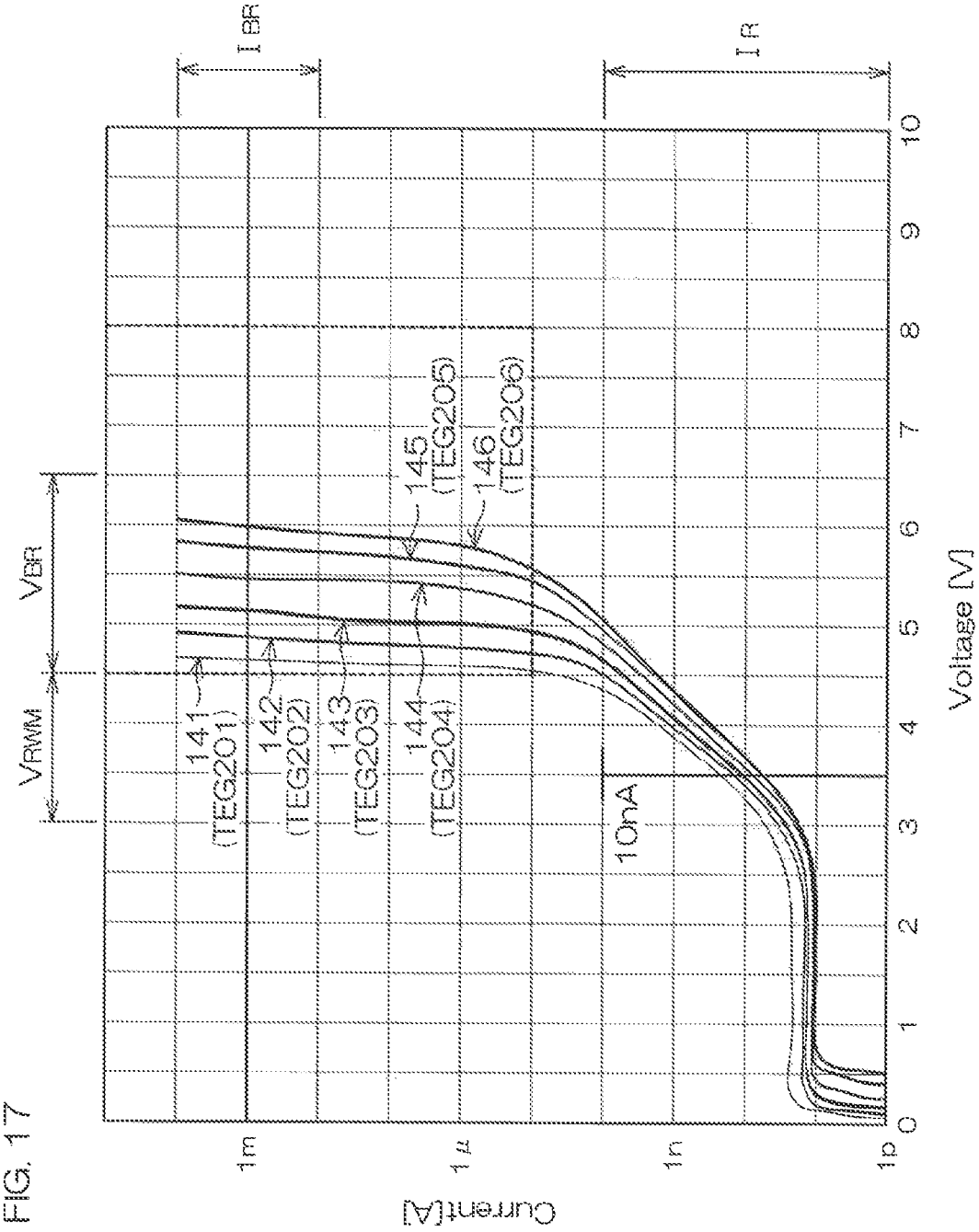
FIG. 17 is a graph showing the current-voltage characteristics of the evaluation devices shown in FIG. 15.
Figure 18:
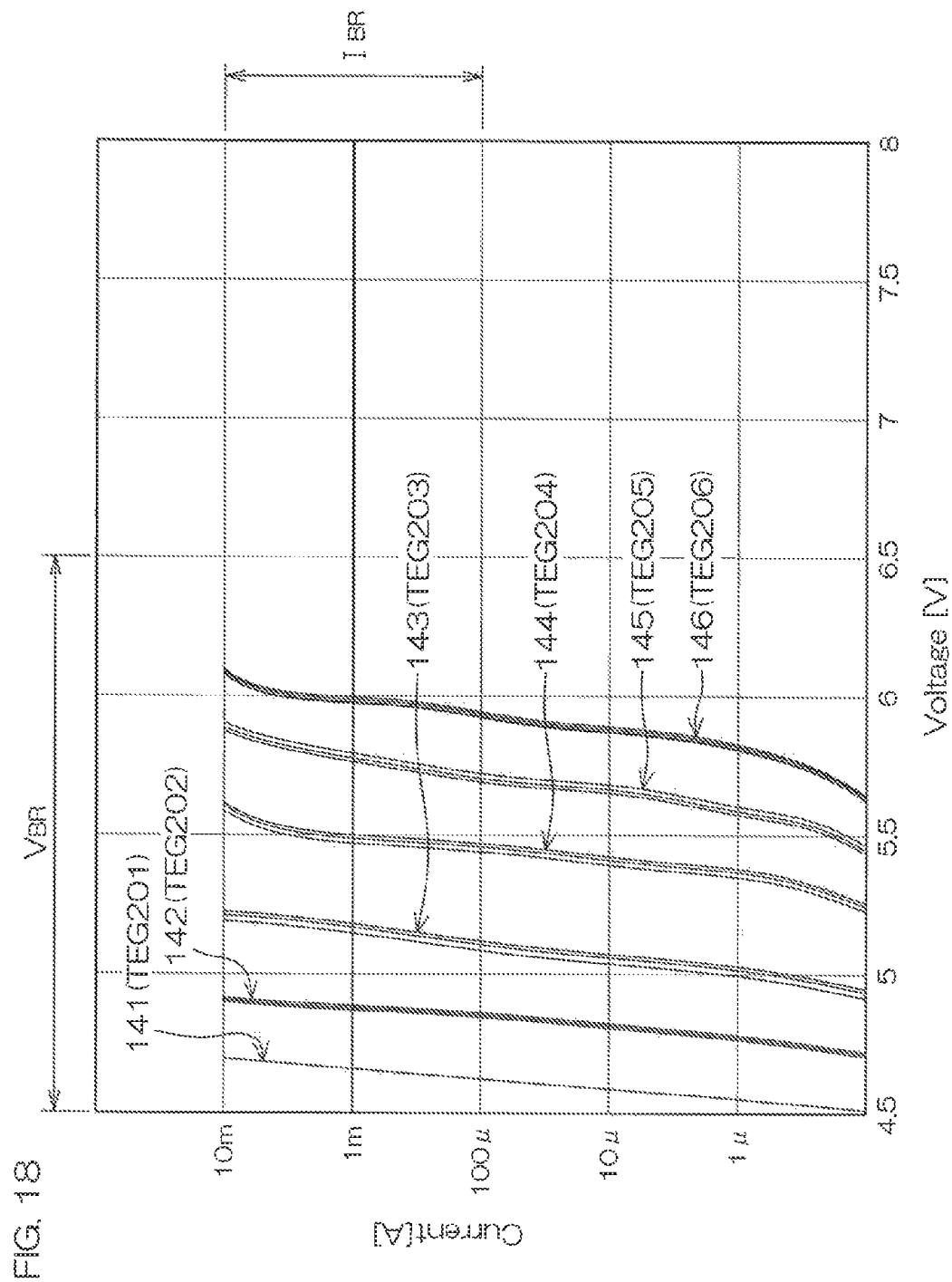
FIG. 18 is an enlarged graph of the portion surrounded by a broken line in FIG. 17.

FIG. 17 is a graph showing the current-voltage characteristics of the first to sixth evaluation devices TEG201 to TEG206 shown in FIG. 15. FIG. 18 is an enlarged graph of a portion surrounded by a broken line in FIG. 17.

In FIGS. 17 and 18, a vertical axis represents the current value between the first external electrode 104 and the second external electrode 105, while a horizontal axis represents the voltage value between the first external electrode 104 and the second external electrode 105. The graphs shown in FIGS. 17 and 18 represent, as current-voltage characteristics, measurements of the voltage between the first external electrode 104 and the second external electrode 105 when a current of 0 A to 10 mA flows between the first external electrode 104 and the second external electrode 105. The current-voltage characteristics areas indicated by curves 141 to 146.

The curve 141 indicates a current-voltage characteristic of the first evaluation device TEG201. The curve 142 indicates a current-voltage characteristic of the second evaluation device TEG202. The second evaluation device TEG202 includes the second evaluation devices TEG202A to TEG202C, which have approximately the same current-voltage characteristics. Accordingly, the characteristics of the second evaluation devices TEG202A to TEG202C are lumped together as the curve 142 in FIGS. 17 and 18.

The curve 143 indicates a current-voltage characteristic of the third evaluation device TEG203. The third evaluation device TEG203 includes the third evaluation devices TEG203A to TEG203C, which have approximately the same current-voltage characteristics. Accordingly, the characteristics of the third evaluation devices TEG203A to TEG203C are lumped together as the curve 143 in FIGS. 17 and 18.

The curve 144 indicates a current-voltage characteristic of the fourth evaluation device TEG204. The fourth evaluation device TEG204 includes the fourth evaluation devices TEG204A to TEG204C, which have approximately the same current-voltage characteristics. Accordingly, the characteristics of the fourth evaluation devices TEG204A to TEG204C are lumped together as the curve 144 in FIGS. 17 and 18.

The curve 145 indicates a current-voltage characteristic of the fifth evaluation device TEG205. The fifth evaluation device TEG205 includes the fifth evaluation devices TEG205A to TEG205C, which have approximately the same current-voltage characteristics. Accordingly, the characteristics of the fifth evaluation devices TEG205A to TEG205C are lumped together as the curve 145 in FIGS. 17 and 18.

The curve 146 indicates a current-voltage characteristic of the sixth evaluation device TEG206. The sixth evaluation device TEG206 includes the sixth evaluation devices TEG206A to TEG206E, which have approximately the same current-voltage characteristics. Accordingly, the characteristics of the sixth evaluation devices TEG206A to TEG206E are lumped together as the curve 146 in FIGS. 17 and 18.

Referring to the curves 141 to 146, the result is that the smaller the width $W_{11}$ of the first impurity regions 108 and the width $W_{21}$ of the second impurity regions 109, the lower a reverse breakdown voltage $V_{BR}$ becomes, while the larger the width $W_{11}$ of the first impurity regions 108 and the width $W_{21}$ of the second impurity regions 109, the higher the reverse breakdown voltage $V_{BR}$ becomes. Referring to the curves 141 to 146, it is found that the reverse breakdown voltage $V_{BR}$ hardly depends on the width $Y_{11}$ of the first contact holes 111 and the width $Y_{21}$ of the second contact holes 112, but decreases depending on the width $W_{11}$ of the first impurity regions 108 and the width $W_{21}$ of the second impurity regions 109.

It is found that like the first to sixth evaluation devices TEG201 to TEG206, the width $W_{11}$ of the first impurity regions 108 and the width $W_{21}$ of the second impurity regions 109 being equal to or greater than 1.0 µm and equal to or smaller than 9.0 µm and the dimension $S_{11}$ of the base region 103 being 4.0 µm allows a reverse breakdown current $I_{BR}$ of equal to or greater than 100 µA and equal to or smaller than 10 mA and the reverse breakdown voltage $V_{BR}$ of equal to or greater than 4.5 V and equal to or smaller than 6.5 V to be achieved. For example, when the reverse breakdown current $I_{BR}$ is set to 1 mA, the reverse breakdown voltage $V_{BR}$ is equal to or greater than 4.5 V and equal to or smaller than 6.0 V.

The reverse breakdown current $I_{BR}$ is defined as a current at which Zener breakdown and/or avalanche breakdown occur. The reverse breakdown voltage $V_{BR}$ is also defined as a voltage at which Zener breakdown and/or avalanche breakdown occur.

Figure 19:
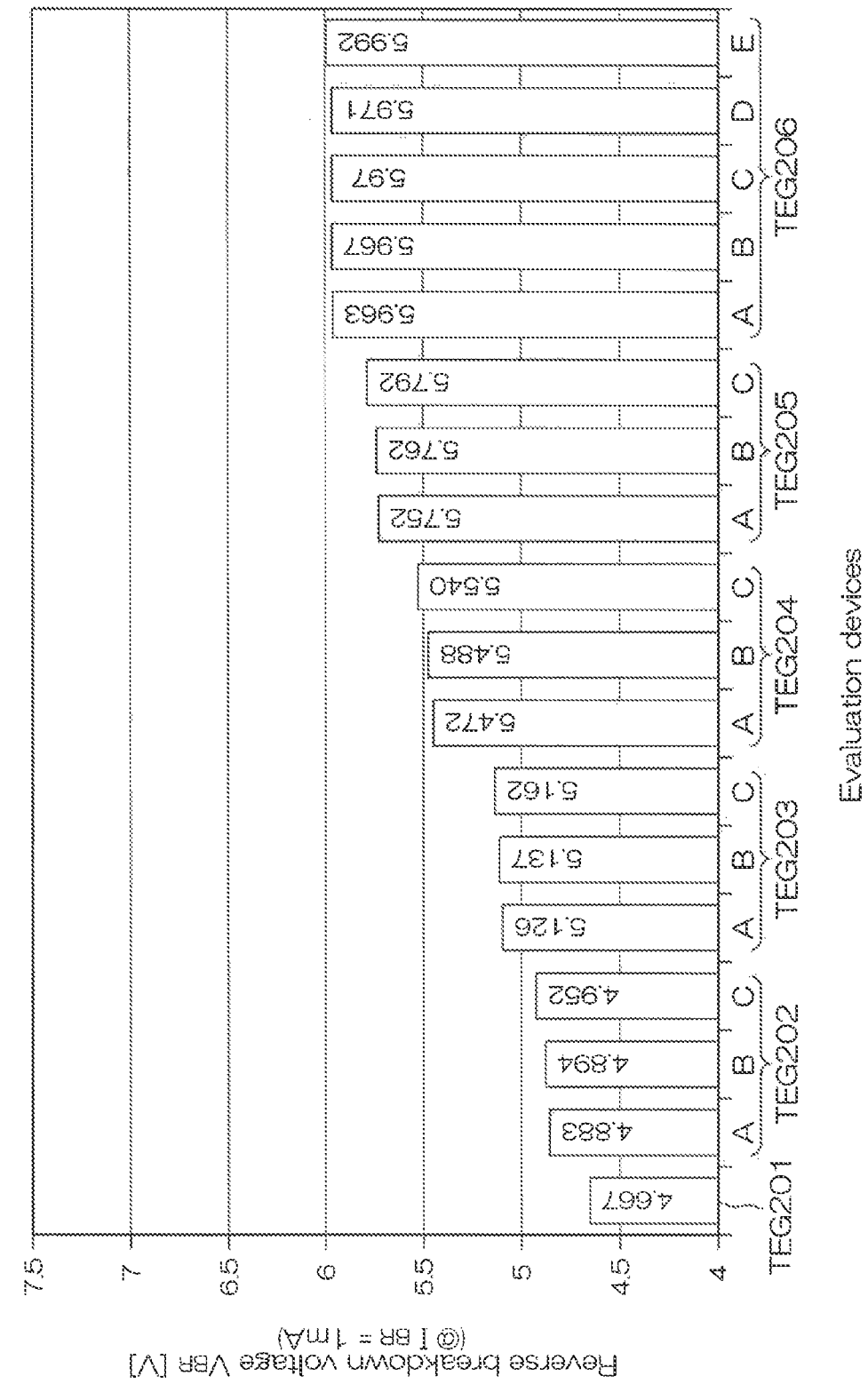
FIG. 19 is a bar graph showing reverse breakdown voltages of the evaluation devices shown in FIG. 15.

Bar graphs of the reverse breakdown voltage $V_{BR}$ when the reverse breakdown current $I_{BR}$ is set to 1 mA are put together in FIG. 19. FIG. 19 is a bar graph showing the reverse breakdown voltage $V_{BR}$ of the first to sixth evaluation devices TEG201 to TEG206 shown in FIG. 15.

Referring to the curve 141 in FIG. 18 and FIG. 19, it is found that the first evaluation device TEG201 (widths $W_{11}$, $W_{21}$=1.0 μm) can achieve a reverse breakdown voltage $V_{BR}$ of equal to or greater than 4.5 V and equal to or smaller than 4.7 V when the reverse breakdown current $I_{BR}$ is equal to or greater than 100 μA and equal to or smaller than 10 mA (1 mA in FIG. 19).

Referring to the curve 142 in FIG. 18 and FIG. 19, it is found that the second evaluation device TEG202 (widths $W_{11}$, $W_{21}$=2.0 μm) can achieve a reverse breakdown voltage $V_{BR}$ of equal to or greater than 4.8 V and equal to or smaller than 5.0 V when the reverse breakdown current $I_{BR}$ is equal to or greater than 100 μA and equal to or smaller than 10 mA (1 mA in FIG. 19). Accordingly, the width $W_{11}$ of the first impurity regions 108 and the width $W_{21}$ of the second impurity regions 109 being equal to or greater than 1.0 μm and equal to or smaller than 2.0 μm allows a reverse breakdown current $I_{BR}$ of equal to or greater than 100 μA and equal to or smaller than 10 mA and a reverse breakdown voltage $V_{BR}$ of equal to or greater than 4.5 V and equal to or smaller than 5.0 V to be achieved.

Referring to the curve 143 in FIG. 18 and FIG. 19, it is found that the third evaluation device TEG203 (widths $W_{11}$, $W_{21}$=3.0 μm) can achieve a reverse breakdown voltage $V_{BR}$ of equal to or greater than 5.0 V and equal to or smaller than 5.2 V when the reverse breakdown current $I_{BR}$ is equal to or greater than 100 μA and equal to or smaller than 10 mA (1 mA in FIG. 19). Accordingly, the width $W_{11}$ of the first impurity regions 108 and the width $W_{21}$ of the second impurity regions 109 being equal to or greater than 1.0 μm and equal to or smaller than 3.0 μm allows a reverse breakdown current $I_{BR}$ of equal to or greater than 100 μA and equal to or smaller than 10 mA and a reverse breakdown voltage $V_{BR}$ of equal to or greater than 4.5 V and equal to or smaller than 5.2 V to be achieved.

Referring to the curve 144 in FIG. 18 and FIG. 19, it is found that the fourth evaluation device TEG204 (widths $W_{11}$, $W_{21}$=5.0 μm) can achieve a reverse breakdown voltage $V_{BR}$ of equal to or greater than 5.4 V and equal to or smaller than 5.6 V when the reverse breakdown current $I_{BR}$ is equal to or greater than 100 μA and equal to or smaller than 10 mA (1 mA in FIG. 19). Accordingly, the width $W_{11}$ of the first impurity regions 108 and the width $W_{21}$ of the second impurity regions 109 being equal to or greater than 1.0 μm and equal to or smaller than 5.0 μm allows a reverse breakdown current $I_{BR}$ of equal to or greater than 100 μA and equal to or smaller than 10 mA and a reverse breakdown voltage $V_{BR}$ of equal to or greater than 4.5 V and equal to or smaller than 5.6 V to be achieved.

Referring to the curve 145 in FIG. 18 and FIG. 19, it is found that the fifth evaluation device TEG205 (widths $W_{11}$, $W_{21}$=7.0 μm) can achieve a reverse breakdown voltage $V_{BR}$ of equal to or greater than 5.7 V and equal to or smaller than 5.8 V when the reverse breakdown current $I_{BR}$ is equal to or greater than 100 μA and equal to or smaller than 10 mA (1 mA in FIG. 19). Accordingly, the width $W_{11}$ of the first impurity regions 108 and the width $W_{21}$ of the second impurity regions 109 being equal to or greater than 1.0 μm and equal to or smaller than 7.0 μm allows a reverse breakdown current $I_{BR}$ of equal to or greater than 100 μA and equal to or smaller than 10 mA and a reverse breakdown voltage $V_{BR}$ of equal to or greater than 4.5 V and equal to or smaller than 5.8 V to be achieved.

Referring to the curve 146 in FIG. 18 and FIG. 19, it is found that the sixth evaluation device TEG206 (widths $W_{11}$, $W_{21}$=9.0 μm) can achieve a reverse breakdown voltage $V_{BR}$ of equal to or greater than 5.9 V and equal to or smaller than 6.0 V when the reverse breakdown current $I_{BR}$ is equal to or greater than 100 μA and equal to or smaller than 10 mA (1 mA in FIG. 19). Accordingly, the width $W_{11}$ of the first impurity regions 108 and the width $W_{21}$ of the second impurity regions 109 being equal to or greater than 1.0 μm and equal to or smaller than 9.0 μm allows a reverse breakdown current $I_{BR}$ of equal to or greater than 100 μA and equal to or smaller than 10 mA and a reverse breakdown voltage $V_{BR}$ of equal to or greater than 4.5 V and equal to or smaller than 6.0 V to be achieved.

Referring to FIG. 17, it is found that the first to sixth evaluation devices TEG201 to TEG206 have a reverse stand-off voltage $V_{RWM}$ within the range of 3 V to 4 V and a leakage current $I_R$ when the reverse stand-off voltage $V_{RWM}$ is applied is kept equal to or smaller than 10 nA. Specifically, it is found that the first to sixth evaluation devices TEG201 to TEG206 have the reverse stand-off voltage $V_{RWM}$ within the range of 3 V to 3.5 V and the leakage current $I_R$ when the reverse stand-off voltage $V_{RWM}$ is applied is kept equal to or smaller than 1 nA. The reverse stand-off voltage $V_{RWM}$ is smaller than the reverse breakdown voltage $V_{BR}$ and defined as the voltage at a stage prior to a transition to Zener breakdown and/or avalanche breakdown.

Figure 20:
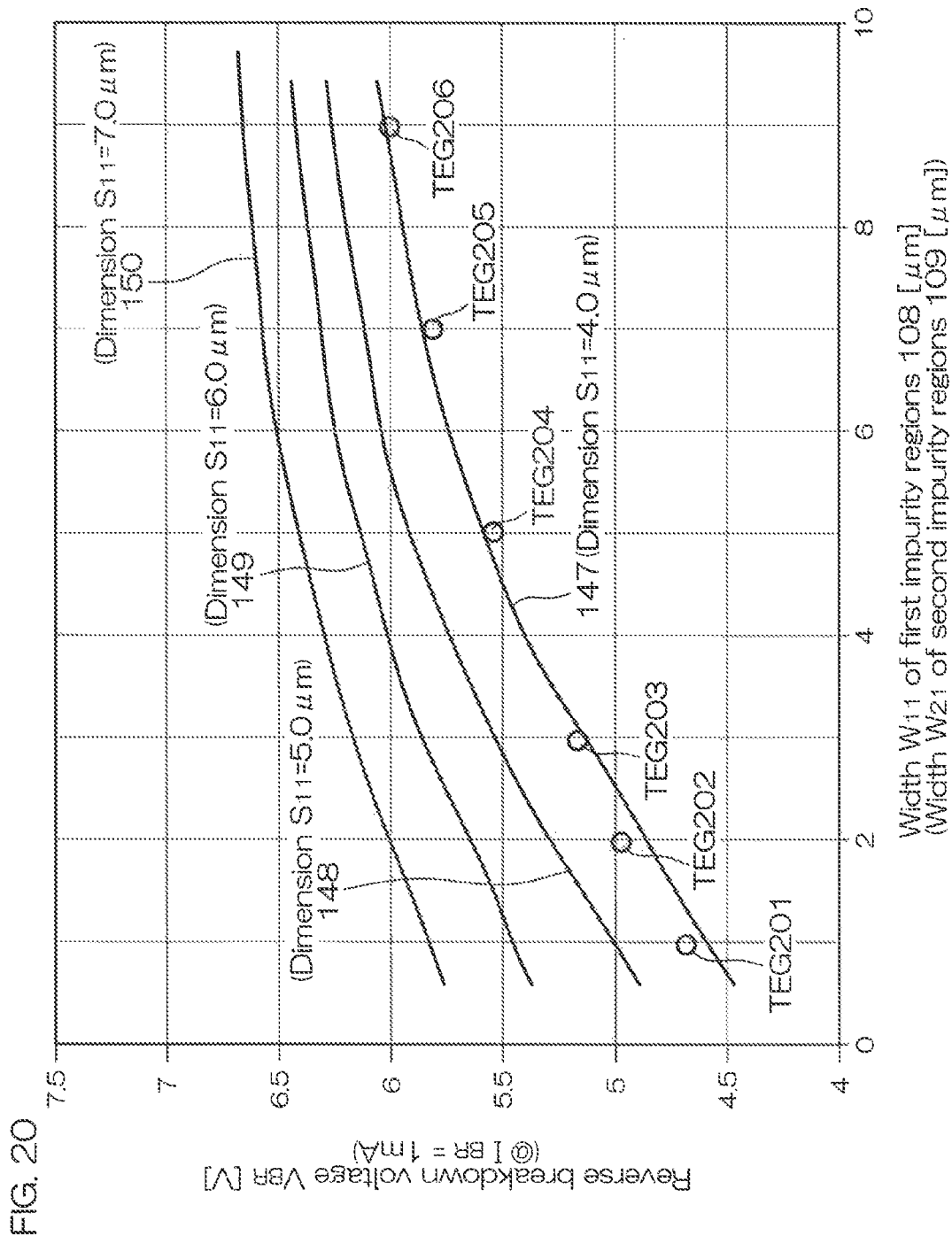
FIG. 20 is a graph for illustrating characteristic regarding adjustment of a reverse breakdown voltage.

The reverse breakdown voltage $V_{BR}$ of the bidirectional Zener diode 101 can also be adjusted by changing the dimension $S_{11}$ of the base region 103, as shown in FIG. 20. FIG. 20 is a graph for illustrating characteristics regarding adjustment of the reverse breakdown voltage $V_{BR}$.

In FIG. 20, a vertical axis represents the reverse breakdown voltage $V_{BR}$, while a horizontal axis represents the width $W_{11}$ of the first impurity regions 108 and the width $W_{21}$ of the second impurity regions 109. The curves 147 to 150 shown in FIG. 20 all indicate the reverse breakdown voltage $V_{BR}$ of the first to sixth evaluation devices TEG201 to TEG206 when the reverse breakdown current $I_{BR}$ is 1 mA.

The curve 147 indicates the reverse breakdown voltage $V_{BR}$ when the dimension $S_{11}$ of the base region 103 is set to 4.0 μm (the dimension $S_{11}$=4.0 μm) in the first to sixth evaluation devices TEG201 to TEG206.

The curve 148 indicates the reverse breakdown voltage $V_{BR}$ when the dimension $S_{11}$ of the base region 103 is set to 5.0 μm (the dimension $S_{11}$=5.0 μm) in the first to sixth evaluation devices TEG201 to TEG206.

The curve 149 indicates the reverse breakdown voltage $V_{BR}$ when the dimension $S_{11}$ of the base region 103 is set to 6.0 μm (the dimension $S_{11}$=6.0 μm) in the first to sixth evaluation devices TEG201 to TEG206.

The curve 150 indicates the reverse breakdown voltage $V_{BR}$ when the dimension $S_{11}$ of the base region 103 is set to 7.0 μm (the dimension $S_{11}$=7.0 μm) in the first to sixth evaluation devices TEG201 to TEG206.

Referring to the curves 147 to 150, the result is that the smaller the dimension $S_{11}$ of the base region 103, the lower the reverse breakdown voltage $V_{BR}$ becomes, while the larger the dimension $S_{11}$ of the base region 103, the higher the reverse breakdown voltage $V_{BR}$ becomes.

Specifically, referring to the curve 147, the dimension $S_{11}$ of the base region 103 set to 4.0 µm results in the reverse breakdown voltage $V_{BR}$ of equal to or greater than 4.5 V and equal to or smaller than 6.0 V, as mentioned above. Referring to the curve 148, the dimension $S_{11}$ of the base region 103 set to 5.0 µm results in the reverse breakdown voltage $V_{BR}$ of equal to or greater than 5.0 V and equal to or smaller than 6.5 V. Referring to the curve 149, the dimension $S_{11}$ of the base region 103 set to 6.0 µm results in the reverse breakdown voltage $V_{BR}$ of equal to or greater than 5.3 V and equal to or smaller than 6.5 V. Referring to the curve 150, the dimension $S_{11}$ of the base region 103 set to 7.0 µm results in the reverse breakdown voltage $V_{BR}$ of equal to or greater than 5.5 V and equal to or smaller than 7.0 V.

Accordingly, the width $W_{11}$ of the first impurity regions 108 and the width $W_{21}$ of the second impurity regions 109 being set to be equal to or greater than 1.0 µm and equal to or smaller than 9.0 µm and the dimension $S_{11}$ of the base region 103 being set to be equal to or greater than 4.0 µm and equal to or smaller than 7.0 µm allows a reverse breakdown voltage $V_{BR}$ of equal to or greater than 4.5 V and equal to or smaller than 7.0 V to be achieved.

For example, the width $W_{11}$ of the first impurity regions 108 and the width $W_{21}$ of the second impurity regions 109 being set to be equal to or greater than 1.0 µm and equal to or smaller than 6.0 µm and the dimension $S_{11}$ of the base region 103 being set to be equal to or greater than 4.0 µm and equal to or smaller than 7.0 µm allows the reverse breakdown voltage $V_{BR}$ of equal to or greater than 4.5 V and equal to or smaller than 6.5 V to be achieved. Further, the width $W_{11}$ of the first impurity regions 108 and the width $W_{21}$ of the second impurity regions 109 being set to be equal to or greater than 1.0 µm and equal to or smaller than 4.0 µm and the dimension $S_{11}$ of the base region 103 being set to be equal to or greater than 4.0 µm and equal to or smaller than 6.0 µm allows the reverse breakdown voltage $V_{BR}$ of equal to or greater than 4.5 V and equal to or smaller than 6.0 V to be achieved. Furthermore, the width $W_{11}$ of the first impurity regions 108 and the width $W_{21}$ of the second impurity regions 109 being set to be equal to or greater than 1.0 µm and equal to or smaller than 2.0 µm and the dimension $S_{11}$ of the base region 103 being set to be equal to or greater than 4.0 µm and equal to or smaller than 5.0 µm allows the reverse breakdown voltage $V_{BR}$ of equal to or greater than 4.5 V and equal to or smaller than 5.5 V to be achieved.

In this reference example, since the width $W_{11}$ of the first impurity regions 108 and the width $W_{21}$ of the second impurity regions 109 are thus set to be equal to or greater than 1.0 µm and equal to or smaller than 9.0 µm, the bidirectional Zener diode 101 of good current-voltage characteristic can be provided. Especially the dimension $S_{11}$ of the base region 103 is set to be equal to or greater than 4.0 µm and equal to or smaller than 7.0 µm, the bidirectional Zener diode 101 can show even better current-voltage characteristic.

Referring again to FIGS. 12A and 12B, a first passivation film 120 including silicon nitride and a resin film 121 including polyimide are formed in this order on the insulating film 110 so as to cover the first internal electrode film 113 and the second internal electrode film 114. A second passivation film 122 including silicon nitride is formed on the side surface of the substrate 102. In the first passivation film 120 and the resin film 121, a first pad opening 123 which exposes the first pad electrode film 116 and a second pad opening 124 which exposes the second pad electrode film 118 are formed.

The first external electrode 104 is embedded in the first pad opening 123 so as to project from the resin film 121. The first external electrode 104 is connected electrically to the first pad electrode film 116 within the first pad opening 123. The second external electrode 105 is embedded in the second pad opening 124 so as to project from the resin film 121. The second external electrode 105 is connected electrically to the second pad electrode film 118 within the second pad opening 124. The first external electrode 104 and the second external electrode 105 may be, for example, an Ni/Pd/Au layered film having an Ni film, a Pd film formed on the Ni film, and an Au film formed on the Pd film.

Referring again to FIG. 11, the second external electrode 105 has portions following the recessed portion 102a and the chamfered portion 102b of the substrate 102 and forms an asymmetric pair with the first external electrode 104. On a surface of each of the first external electrode 104 and the second external electrode 105, a flat portion 130 having a rectangular shape in planar view and multiple convex portions 131 having a quadrilateral shape or a rectangular shape in planar view are formed. The flat portion 130 is a portion in which the surface of each of the first external electrode 104 and the second external electrode 105 is made flat, and formed in a central portion on the surface of each of the first external electrode 104 and the second external electrode 105.

The multiple convex portions 131 are formed around the flat portion 130 of each of the first external electrode 104 and the second external electrode 105 to form undulation in a peripheral edge portion on the surface of each of the first external electrode 104 and the second external electrode 105. The multiple convex portions 131 are each formed in a surface area smaller than that of the flat portion 130 in a staggered arrangement in which the portions 130 are staggered along the lateral direction of the substrate 102. Some of the multiple convex portions 131 may be integrated with the flat portion 130.

The thus arranged first external electrode 104 and second external electrode 105 can successfully and irregularly reflect light applied on the surface of the first external electrode 104 and the second external electrode 105. This allows the first external electrode 104 and the second external electrode 105 to be identified successfully, whereby the two sides of the bidirectional Zener diode 101 can be discerned easily. In addition, when conducting an electrical test, it is possible to press the tip end portion of a probe against the flat portion 130 of each of the first external electrode 104 and the second external electrode 105 to thereby measure the electrical properties of the bidirectional Zener diode 101 successfully.

Moreover, the convex and recessed portions formed on the surface of each of the first external electrode 104 and the second external electrode 105 allow the surface area of each of the first external electrode 104 and the second external electrode 105 to be increased. This allows, when the bidirectional Zener diode 101 is mounted on a mounting board via joint material such as solder, the contact area between the surface of each of the first external electrode 104 and the second external electrode 105 and the joint material to be increased. It is therefore possible to mount the bidirectional Zener diode 101 on the mounting board successfully.

As described above, in this reference example, the width $W_{11}$ of the first impurity regions 108 and the width $W_{21}$ of the second impurity regions 109 are set to be equal to or greater than 1.0 µm and equal to or smaller than 9.0 µm. In addition, the dimension $S_{11}$ of the base region 103 is set to be equal to or greater than 4.0 µm and equal to or smaller than 7.0 µm. This allows for achieving the reverse breakdown current $I_{BR}$ of equal to or greater than 100 µA and equal to or smaller than 10 mA and the reverse breakdown voltage $V_{BR}$ of equal to or greater than 4.5 V and equal to or smaller than 7.0V. Further, this allows the reverse stand-off voltage $V_{RWM}$ of equal to or greater than 3 V and equal to or smaller than 4 V and the leakage current $I_R$ of equal to or smaller than 10 nA to be achieved.

Furthermore, in this reference example, it is only required to form, in the surficial portion of the base region 103, the first impurity regions 108 and the second impurity regions 109 in a manner spaced apart from each other, which allows a relatively simple structure to be achieved. Accordingly, no complicated process is required for the formation of the pn junctions and thereby cost increases can be suppressed.

Figure 21:
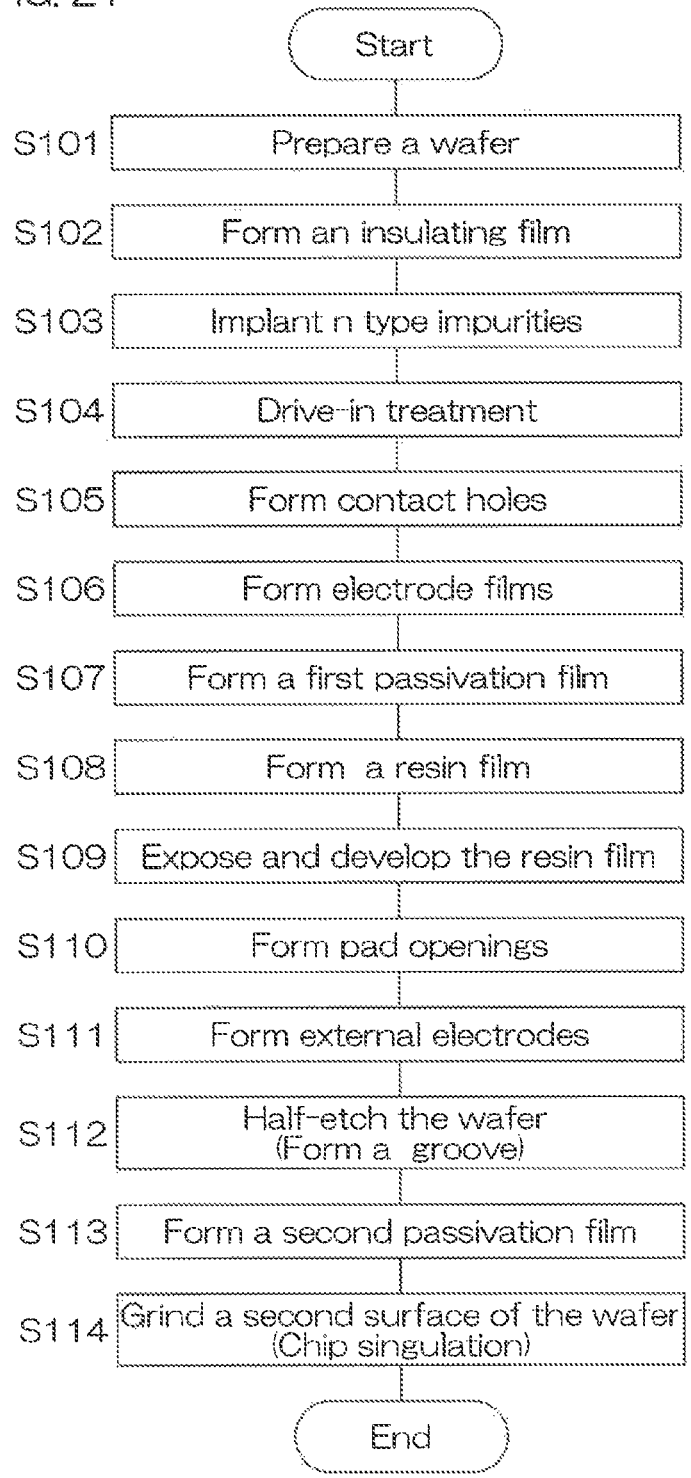
FIG. 21 is a flowchart for illustrating an exemplary process of manufacturing the bidirectional Zener diode shown in FIG. 11.

FIG. 21 is a flowchart for illustrating an exemplary process of manufacturing the bidirectional Zener diode 101 shown in FIG. 11.

First, a disk-shaped wafer is prepared as a source of the substrate 102 (Step S101). Multiple chip regions correspond to the bidirectional Zener diode 101 are set on the surface of the wafer. Next, the insulating film 110 is formed on the surface of the wafer through a thermal oxidation treatment, for example (Step S102).

Next, n type impurities are implanted into regions in which the first impurity regions 108 are to be formed and regions in which the second impurity regions 109 are to be formed in a surficial portion of the wafer (Step S103). Next, a heat treatment (drive-in treatment) is conducted to diffuse the n type impurities implanted into the wafer and thereby to form the first impurity regions 108 and the second impurity regions 109 (Step S104). The reverse breakdown voltage $V_{BR}$ of the bidirectional Zener diode 101 varies depending on the temperature and duration of this heat treatment. Results of the investigation of how the reverse breakdown voltage $V_{BR}$ varies depending on the conditions of the heat treatment are shown in FIG. 22.

Figure 22:
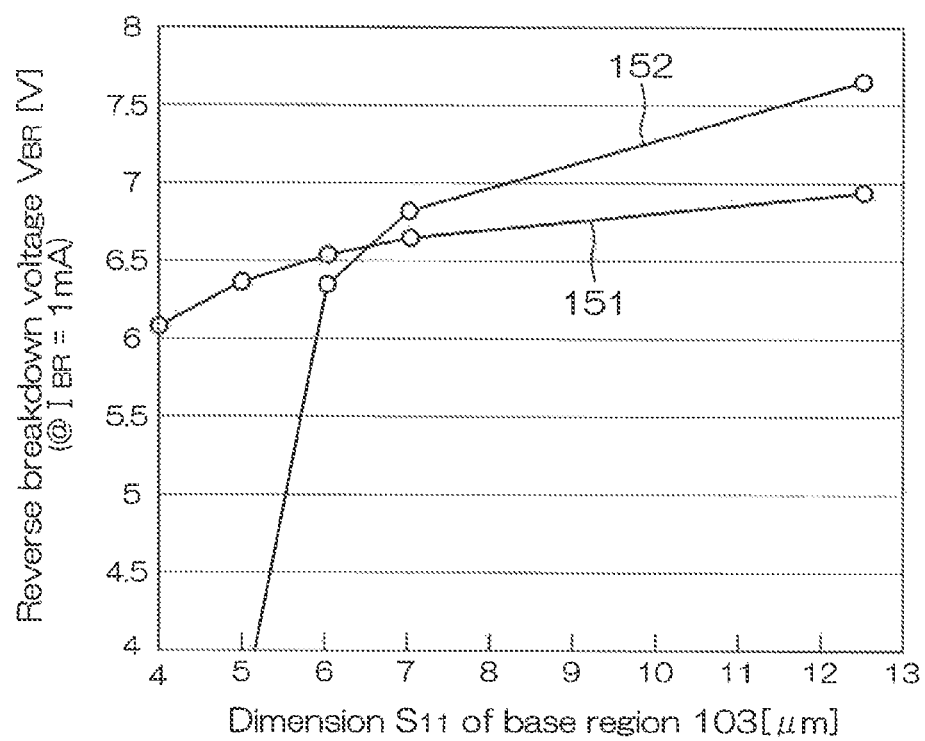
FIG. 22 is a graph for illustrating characteristics regarding adjustment of a reverse breakdown voltage.

FIG. 22 is a graph for illustrating characteristics regarding adjustment of the reverse breakdown voltage $V_{BR}$. In FIG. 22, a vertical axis represents the reverse breakdown voltage $V_{BR}$, while a horizontal axis represents the dimension $S_{11}$ of the base region 103. FIG. 22 shows results of the investigation of the reverse breakdown voltage $V_{BR}$ for each of five prepared evaluation devices (not shown) with the dimension $S_{11}$ of the base region 103 set to 4.0 µm, 5.0 µm, 6.0 µm, 7.0 µm, and 12.5 µm, respectively.

Referring to FIG. 22, a polygonal lines 151 and a polygonal lines 152 both indicate the reverse breakdown voltage $V_{BR}$ of the five evaluation devices (not shown) when the reverse breakdown current $I_{BR}$ is 1 mA.

The polygonal line 151 indicates the reverse breakdown voltage $V_{BR}$ when the n type impurities are diffused through a low-temperature process in which a relatively small amount of heat is applied to the wafer. In the low-temperature process, the temperature of the heat treatment is, for example, equal to or higher than 900° C. and equal to or lower than 1100° C., and the duration of the heat treatment is, for example, equal to or longer than 20 seconds and equal to or shorter than 60 minutes. When the temperature of the heat treatment is equal to or higher than 900° C. and equal to or lower than 1000° C., the duration of the heat treatment may be equal to or longer than 30 minutes and equal to or shorter than 60 minutes. When the temperature of the heat treatment is higher than 1000° C. and equal to or lower than 1100° C., the duration of the heat treatment may be equal to or longer than 20 seconds and equal to or shorter than 30 minutes.

On the other hand, the polygonal line 152 indicates the reverse breakdown voltage $V_{BR}$ when the n type impurities are diffused through a high-temperature process in which a larger amount of heat than the low-temperature process is applied to the wafer. In the high-temperature process, the temperature of the heat treatment is, for example, 1200° C., and the duration of the heat treatment is, for example, about 60 minutes.

Through comparison between the polygonal line 151 and the polygonal line 152, it is found that as the amount of heat applied to the wafer becomes larger, the reverse breakdown voltage $V_{BR}$ tends to be higher. Referring to the polygonal line 152, it is found that the evaluation devices with the dimension $S_{11}$ of the base region 103 set to be equal to or smaller than 5.0 µm undergo a rapid decrease in the reverse breakdown voltage $V_{BR}$ when the high-temperature process is applied.

FIG. 23 is a graph showing the current-voltage characteristic of the evaluation devices when a high-temperature process is applied in Step S104 of FIG. 21. FIG. 23 corresponds to FIG. 17 above.

In FIG. 23, the curve 153 indicates the current-voltage characteristic of the evaluation device with the dimension $S_{11}$ of the base region 103 set to 12.5 µm. The curve 154 indicates the current-voltage characteristic of the evaluation device with the dimension $S_{11}$ of the base region 103 set to 7.0 µm. The curve 155 indicates the current-voltage characteristic of the evaluation device with the dimension $S_{11}$ of the base region 103 set to 6.0 µm. The curve 156 indicates the current-voltage characteristic of the evaluation device with the dimension $S_{11}$ of the base region 103 set to 5.0 µm. The curve 157 indicates the current-voltage characteristic of the evaluation device with the dimension $S_{11}$ of the base region 103 set to 4.0 µm.

Referring to the curves 156 and 157, the evaluation devices with the dimension $S_{11}$ of the base region 103 set to be equal to or smaller than 5.0 µm undergo a rapid increase in the leakage current $I_R$ with a rapid decrease in the reverse breakdown voltage $V_{BR}$, resulting in a substantially normally-ON state.

In the high-temperature process, the n type impurities implanted into the wafer diffuse over a wide range. As a result, it is believed that depletion layers extending from the pn junction portions between the first impurity regions 108 and the base region 103 overlap depletion layers extending from the pn junction portions between the second impurity regions 109 and the base region 103, resulting in a state where a current flows constantly or near that and therefore there is a rapid increase in the leakage current $I_R$. It is believed that the evaluation devices, which have the dimension $S_{11}$ of the base region 103 of equal to or smaller than 5.0 µm, particularly face such an issue, because the dimension $S_{11}$ of the base region 103 is relatively small.

It is therefore only required to perform the step of forming the first impurity regions 108 and the second impurity regions 109 by diffusing the n type impurities at an amount of heat at which depletion layers extending from the pn junction portions between the first impurity regions 108 and the base region 103 do not overlap depletion layers extending from the pn junction portions between the second impurity regions 109 and the base region 103. The result of performing this as a low-temperature process is indicated by the polygonal line 151 in FIG. 22. As understood also from FIG. 17 above, the application of the low-temperature process then allows the leakage current $I_R$ to be effectively suppressed or prevented from being increased rapidly and the bidirectional Zener diode 101 can achieve good electrical properties.

Referring again to FIG. 21, after the heat treatment in Step S104, the first contact holes 111 which expose the first impurity regions 108 and the second contact holes 112 which expose the second impurity regions 109 are formed in the insulating film 110 by etching via a mask, for example (Step S105). Next, a sputtering method, for example, is used to deposit Al so as to cover the insulating film 110 and thereby to form an electrode film on the insulating film 110 (Step S106). Next, the electrode film is patterned into a desired shape by etching via a mask. The first internal electrode film 113 and the second internal electrode film 114 are thus formed.

Next, a CVD method, for example, is used to deposit a nitride film so as to cover the first internal electrode film 113 and the second internal electrode film 114 and thereby to form the first passivation film 120 (Step S107). Next, photosensitive polyimide is provided on the first passivation film 120 to form the resin film 121 (Step S108). Next, the resin film 121 is developed after exposed selectively by an exposure light. Accordingly, a pattern that corresponds to the first pad opening 123 and the second pad opening 124 is formed in the resin film 121 (Step S109). Next, the resin film 121 is used as a mask to etch the first passivation film 120 and thereby to form the first pad opening 123 and the second pad opening 124 (Step S110).

Next, an Ni film, a Pd film, and an Au film are formed through plating in this order so as to fill the first pad opening 123 and the second pad opening 124 and thereby to form the first external electrode 104 and the second external electrode 105 (Step S111). Next, the wafer is half-etched so as to define the chip regions and thereby to form a groove that defines the chip regions (Step S112). Next, a CVD method, for example, is used to deposit silicon nitride on an interior surface of the groove and thereby to form the second passivation film 122 (Step S113). Next, the second surface of the wafer is ground to communicate with the groove (Step S114). This causes singulation into multiple bidirectional Zener diodes 101.

While the modes according to the preferred embodiment of the present invention and the reference example have been described, the modes according to the preferred embodiment of the present invention and the reference example may be implemented in still another mode.

For example, in the above-described preferred embodiment, the conductivity type of the base region 3 (substrate 2), the conductivity type of the first impurity regions 8 and the conductivity type of the second impurity regions 9 may be inverted. That is, the p type portions may be n type, while the n type portions may be p type.

The bidirectional Zener diode 1 provided in the above-described preferred embodiment may be incorporated into an electronic device or a mobile terminal such as a portable electronic device as a circuit component for power circuits, high-frequency circuits, digital circuits, for example.

Further, in the mode according to the above-described reference example, the conductivity type of the base region 103 (substrate 102), the conductivity type of the first impurity regions 108 and the conductivity type of the second impurity regions 109 may be inverted. That is, the p type portions may be n type, while the n type portions may be p type.

Further, the bidirectional Zener diode 101 provided in the above-described reference example may be incorporated into an electronic device or a mobile terminal such as a portable electronic device as a circuit component for power circuits, high-frequency circuits, digital circuits, for example.

Additionally, various design changes can be applied within the scope of the matters described in the appended claims. Exemplary features extracted from the specification and the drawings are shown below.

Item 1: A bidirectional Zener diode including a substrate, a first conductivity type base region formed in a surficial portion of the substrate, a second conductivity type first impurity region formed in a surficial portion of the base region so as to form a pn junction between the first impurity region and the base region, a second conductivity type second impurity region formed in a surficial portion of the base region in a manner spaced apart from the first impurity region so as to form a pn junction between the second impurity region and the base region, a first electrode arranged at a surface of the substrate so as to be connected electrically to the first impurity region, and a second electrode arranged at the surface of the substrate so as to be connected electrically to the second impurity region, wherein a width of the first impurity region and/or a width of the second impurity region are equal to or greater than 1.0 µm and equal to or smaller than 9.0 µm.

In accordance with the bidirectional Zener diode according to Item 1, the width of the first impurity region and/or the width of the second impurity region are set to be equal to or greater than 1.0 µm and equal to or smaller than 9.0 µm. This allows excellent electrical properties to be achieved. For example, including the features of the bidirectional Zener diode according to Item 1 allows a reverse breakdown current of equal to or greater than 100 µA and equal to or smaller than 10 mA and a reverse breakdown voltage of equal to or greater than 4.5 V and equal to or smaller than 7.0 V to be achieved. Including the features of the bidirectional Zener diode according to Item 1 also allows a reverse stand-off voltage of equal to or greater than 3 V and equal to or smaller than 4 V to be achieved. Including the features of the bidirectional Zener diode according to Item 1 further allows a leakage current of equal to or smaller than 10 nA to be achieved when the reverse stand-off voltage is applied.

Further, in accordance with the bidirectional Zener diode according to Item 1, it is only required to form, in the surficial portion of the base region, the first impurity region and the second impurity region in a manner spaced apart from each other, which allows a relatively simple structure to be achieved. Accordingly, no complicated process is required for the formation of the pn junctions and thereby cost increases can be suppressed.

Item 2: The bidirectional Zener diode according to Item 1, in which a reverse breakdown current is equal to or greater than 100 µA and equal to or smaller than 10 mA and a reverse breakdown voltage is equal to or greater than 4.5 V and equal to or smaller than 7.0 V.

Item 3: The bidirectional Zener diode according to Item 1, in which a dimension of the base region along the surface of the substrate between the first impurity region and the second impurity region is equal to or greater than 4.0 µm and equal to or smaller than 7.0 µm.

Item 4: The bidirectional Zener diode according to 1, in which a reverse stand-off voltage is equal to or greater than 3 V and equal to or smaller than 4V and, when the reverse stand-off voltage is applied, a leakage current flowing between the first electrode and the second electrode is equal to or smaller than 10 nA.

Item 5: The bidirectional Zener diode according to 1, in which multiple first impurity regions are formed, multiple second impurity regions are formed, and the first impurity regions and the second impurity regions are arranged alternately.

Item 6: A method for manufacturing the bidirectional Zener diode according to Item 1, including a step of forming the first impurity region by implanting second conductivity type impurities into the surficial portion of the substrate and subsequently conducting a heat treatment and a step of forming the second impurity region by implanting second conductivity type impurities into the surficial portion of the substrate and subsequently conducting a heat treatment, wherein the temperature of the heat treatment in the step of forming the first impurity region and the temperature of the heat treatment in the step of forming the second impurity region are equal to or higher than 900° C. and equal to or lower than 1100° C.

Item 7: The bidirectional Zener diode manufacturing method according to Item 6, in which a duration of the heat treatment in the step of forming the first impurity region and a duration of the heat treatment in the step of forming the second impurity region are equal to or longer than 20 seconds and equal to or shorter than 60 minutes.

Item 8: A method for manufacturing a bidirectional Zener diode, including a step of preparing a substrate with a first conductivity type base region formed in a surficial portion thereof, a step of forming a first impurity region, which forms a pn junction between the first impurity region and the base region, by implanting second conductivity type impurities into the surficial portion of the substrate and subsequently conducting a heat treatment, and a step of forming, in a manner spaced apart from the first impurity region, a second impurity region, which forms a pn junction between the second impurity region and the base region, by implanting second conductivity type impurities into a region different from the region in which the first impurity region is formed in the surficial portion of the substrate and subsequently conducting a heat treatment, wherein the temperature of the heat treatment in the step of forming the first impurity region and the temperature of the heat treatment in the step of forming the second impurity region are equal to or higher than 900° C. and equal to or lower than 1100° C.

Item 9: The bidirectional Zener diode manufacturing method according to Item 8, in which a duration of the heat treatment in the step of forming the first impurity region and the duration of the heat treatment in the step of forming the second impurity region are equal to or longer than 20 seconds and equal to or shorter than 60 minutes.

This application corresponds to Japanese Patent Application No. 2015-188513 filed in the Japan Patent Office on Sep. 25, 2015, Japanese Patent Application No. 2015-188514 filed in the Japan Patent Office on Sep. 25, 2015, and Japanese Patent Application No. 2016-147655 filed in the Japan Patent Office on Jul. 27, 2016, the disclosures of which are incorporated herein by reference in their entirety.

The preferred embodiments of the present invention, which have been described above in detail, are merely specific examples used to clarify the technical details of the present invention, and the present invention should not be construed as being limited to these specific examples. The scope of the present invention is to be limited only by the scope of the appended claims.

What is claimed is:

1. A bidirectional Zener diode comprising:
a substrate;
a base region of a first conductivity type formed in a surficial portion of the substrate;
a first impurity region group extending along a predetermined array direction, in which a plurality of first impurity regions of a second conductivity type is arranged in a manner spaced apart from each other along the predetermined array direction, each of the first impurity regions being formed in a surficial portion of the base region so as to form a pn junction between the first impurity region and the base region;
a second impurity region group extending in parallel with the first impurity region group along the predetermined array direction, in which a plurality of second impurity regions of a second conductivity type is arranged in a manner spaced apart from each other along the predetermined array direction, each of the second impurity regions being formed in a surficial portion of the base region in a manner spaced apart from the first impurity regions so as to form a pn junction between the second impurity region and the base region;
a first electrode arranged at a surface of the substrate so as to be connected electrically to at least one of the first impurity regions, and to be disconnected from at least another one of the first impurity regions; and
a second electrode arranged at the surface of the substrate so as to be connected electrically to at least one of the second impurity regions.

2. The bidirectional Zener diode according to claim 1, wherein the bidirection Zener diode has a reverse breakdown current equal to or greater than 100 µA and equal to or smaller than 10 mA, and
the bidirection Zener diode has a reverse breakdown voltage equal to or greater than 6 V and equal to or smaller than 7 V.

3. The bidirectional Zener diode according to claim 1, wherein a dimension of the base region along the surface of the substrate between the first impurity region and the second impurity region is equal to or greater than 4.0 µm and equal to or smaller than 5.0 µm.

4. The bidirectional Zener diode according to claim 3, wherein
the bidirection Zener diode has a reverse breakdown current equal to or greater than 100 µA and equal to or smaller than 10 mA, and
the bidirection Zener diode has a reverse breakdown voltage equal to or greater than 6 V and equal to or smaller than 6.5 V.

5. The bidirectional Zener diode according to claim 1, wherein
the bidirection Zener diode has a reverse stand-off voltage equal to or greater than 3 V and equal to or smaller than 5 V, and
when the reverse stand-off voltage is applied, a leakage current flowing between the first electrode and the second electrode is equal to or smaller than 10 nA.

6. The bidirectional Zener diode according to claim 1, wherein
the bidirection Zener diode has a reverse stand-off voltage equal to or greater than 3 V and equal to or smaller than 4 V, and
when the reverse stand-off voltage is applied, a leakage current flowing between the first electrode and the second electrode is equal to or smaller than 1 nA.

7. The bidirectional Zener diode according to claim 1, wherein
a plurality of the first impurity region groups is formed,
a plurality of the second impurity region groups is formed, and the first impurity region groups and the second impurity region groups are arranged alternately along a direction orthogonal to the predetermined array direction.

8. The bidirectional Zener diode according to claim 1, wherein the first impurity regions and the second impurity regions are arranged in an abutting manner along a direction orthogonal to the predetermined array direction.

9. The bidirectional Zener diode according to claim 1, wherein
- a dimension of the base region along the surface of the substrate between the first impurity region and the second impurity region is equal to or greater than 4.0 µm and equal to or smaller than 12.5 µm.

10. The bidirectional Zener diode according to claim 1, further comprising:
- an insulating film covering a surface of the substrate;
- a first electrode film connected to the first electrode and formed on a surface of the insulating film, the first electrode film opposing the first impurity region group with the insulating film interposed therebetween; and
- a second electrode film connected to the second electrode and formed on the surface of the insulating film, the second electrode film opposing the second impurity region group with the insulating film interposed therebetween; wherein the insulating film has a first contact hole through which the first electrode film is connected to the at least one of the first impurity regions while the at least another one of the first impurity regions is separated from the first electrode film by the insulating film, and the insulating film has a second contact hole through which the second electrode film is connected to the at least one of the second impurity regions.

* * * * *